(12) United States Patent  
Yakubo et al.

(10) Patent No.: US 11,714,438 B2  
(45) Date of Patent: Aug. 1, 2023

(54) SEMICONDUCTOR DEVICE, ELECTRONIC COMPONENT, AND ELECTRONIC DEVICE

(71) Applicant: SEMICONDUCTOR ENERGY LABORATORY CO., LTD., Atsugi (JP)

(72) Inventors: Yuto Yakubo, Kanagawa (JP); Kei Takahashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 84 days.

(21) Appl. No.: 16/961,991

(22) PCT Filed: Jan. 10, 2019

(86) PCT No.: PCT/IB2019/050173
§ 371 (c)(1),
(2) Date: Jul. 14, 2020

(87) PCT Pub. No.: WO2019/145803

PCT Pub. Date: Aug. 1, 2019

(65) Prior Publication Data

US 2020/0401170 A1 Dec. 24, 2020

(30) Foreign Application Priority Data

Jan. 24, 2018 (JP) .................................. 2018-009327

(51) Int. Cl.
*G05F 1/56* (2006.01)
*H01L 27/06* (2006.01)
(Continued)

(52) U.S. Cl.
CPC ............. *G05F 1/56* (2013.01); *G09G 3/3233* (2013.01); *G09G 3/3696* (2013.01); *H01L 27/0629* (2013.01); *H01L 29/24* (2013.01)

(58) Field of Classification Search
None
See application file for complete search history.

(56) References Cited

U.S. PATENT DOCUMENTS 4,553,098 A   11/1985   Yoh et al.
4,559,694 A   12/1985   Yoh et al.
(Continued)

FOREIGN PATENT DOCUMENTS

CN   001469482 A   1/2004
CN   102176237 A   9/2011
(Continued)

OTHER PUBLICATIONS

International Search Report (Application No. PCT/IB2019/050173) dated Apr. 2, 2019.
(Continued)

*Primary Examiner* — Daniel C Puentes
(74) *Attorney, Agent, or Firm* — Fish & Richardson P.C.

(57) ABSTRACT

A semiconductor device capable of changing drive capability as appropriate is provided. A semiconductor device (100A) includes first to third circuits (102, 103, 101) and a first holding circuit (SH2), and the first holding circuit (SH2) includes a first holding portion (node ND2) and holds a first potential. The first circuit (102) has a function of changing the first potential of the first holding portion (node ND2) to a second potential, and the second circuit (103) has a function of generating a bias current based on the first potential or the second potential of the first holding portion (node ND2). The third circuit (101) includes first to third terminals (TLa4, TLa1, TLa2) and has a function of generating a third potential in accordance with an input potential to the second terminal (TLa1) by supply of the bias current to the first terminal (TLa4) and outputting the third potential from the third terminal (TLa2). Thus, the amount of the bias current generated in the second circuit (103) is increased or decreased by the first circuit (102).

18 Claims, 20 Drawing Sheets

(51) Int. Cl.
  *H01L 29/24* (2006.01)
  *G09G 3/3233* (2016.01)
  *G09G 3/36* (2006.01)

(56) References Cited

U.S. PATENT DOCUMENTS

| | | |
|---|---|---|
| 5,159,260 A | 10/1992 | Yoh et al. |
| 5,384,740 A | 1/1995 | Etoh et al. |
| 5,731,856 A | 3/1998 | Kim et al. |
| 5,744,864 A | 4/1998 | Cillessen et al. |
| 6,114,907 A | 9/2000 | Sakurai |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,785,344 B1* | 8/2004 | Jiang .............. H04L 25/062 375/317 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,068,019 B1* | 6/2006 | Chiu .............. H03F 3/45475 323/273 |
| 7,105,868 B2 | 9/2006 | Nause et al. |
| 7,211,825 B2 | 5/2007 | Shih et al. |
| 7,224,208 B2 | 5/2007 | Matsushita |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,432,737 B2 | 10/2008 | Yoshida |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,612,587 B2* | 11/2009 | Cheng .............. G11C 7/222 327/99 |
| 7,674,650 B2 | 3/2010 | Akimoto et al. |
| 7,714,633 B2 | 5/2010 | Kato |
| 7,732,819 B2 | 6/2010 | Akimoto et al. |
| 7,746,168 B2 | 6/2010 | Oishi |
| 7,847,593 B2 | 12/2010 | Yoshida |
| 7,956,686 B2 | 6/2011 | Yuasa |
| 8,054,121 B2 | 11/2011 | Kato |
| 8,134,355 B2 | 3/2012 | Inoue et al. |
| 8,159,267 B2 | 4/2012 | Yoshida |
| 8,344,788 B2 | 1/2013 | Yamazaki et al. |
| 8,582,349 B2 | 11/2013 | Yamazaki et al. |
| 8,643,400 B2 | 2/2014 | Yoshida |
| 8,823,439 B2 | 9/2014 | Yamazaki et al. |
| 9,136,391 B2 | 9/2015 | Yamazaki et al. |
| 9,177,667 B2 | 11/2015 | Yoshida |
| 9,396,676 B2 | 7/2016 | Yoshida |
| 9,742,356 B2 | 8/2017 | Takahashi et al. |
| 9,984,640 B2 | 5/2018 | Yoshida |
| 10,560,056 B2 | 2/2020 | Takahashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0001632 A1* | 1/2003 | Anderson .............. H03F 3/345 327/112 |
| 2003/0132930 A1 | 7/2003 | Kimura |
| 2003/0189401 A1 | 10/2003 | Kido et al. |
| 2003/0218222 A1 | 11/2003 | Wager, III et al. |
| 2003/0231524 A1 | 12/2003 | Ohsawa |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0195020 A1 | 9/2005 | Matsushita |
| 2005/0199959 A1 | 9/2005 | Chiang et al. |
| 2005/0274982 A1 | 12/2005 | Ueda et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0152752 A1 | 7/2007 | Oishi |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0242536 A1 | 10/2007 | Matsubara |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2010/0007417 A1 | 1/2010 | Yuasa |
| 2010/0065844 A1 | 3/2010 | Tokunaga |
| 2010/0085030 A1 | 4/2010 | Inoue et al. |
| 2010/0092800 A1 | 4/2010 | Itagaki et al. |
| 2010/0109002 A1 | 5/2010 | Itagaki et al. |
| 2010/0164466 A1 | 7/2010 | Jo |
| 2010/0270997 A1 | 10/2010 | Riedel |
| 2011/0074508 A1 | 3/2011 | Imura |
| 2011/0181349 A1 | 7/2011 | Yamazaki et al. |
| 2012/0049889 A1 | 3/2012 | Hatano |
| 2012/0140523 A1 | 6/2012 | Takahashi et al. |
| 2012/0249237 A1* | 10/2012 | Garrity .............. H03F 3/45986 330/127 |
| 2013/0002220 A1* | 1/2013 | Terada .............. G05F 1/56 323/282 |
| 2013/0207727 A1 | 8/2013 | Kusuda |
| 2013/0271220 A1* | 10/2013 | Takahashi .............. G05F 1/56 330/293 |
| 2015/0034948 A1 | 2/2015 | Takahashi |
| 2016/0033564 A1 | 2/2016 | Chang et al. |

(56) References Cited

U.S. PATENT DOCUMENTS

2018/0102741 A1    4/2018    Takahashi et al.
2020/0177132 A1    6/2020    Takahashi et al.

FOREIGN PATENT DOCUMENTS

| CN | 106205455 A    | 12/2016 |
|----|----------------|---------|
| DE | 102013206284   | 10/2013 |
| JP | 2005-196251 A  | 7/2005  |
| JP | 2007-184688 A  | 7/2007  |
| JP | 2011-096210 A  | 5/2011  |
| JP | 2013-235564 A  | 11/2013 |
| JP | 2016-219028 A  | 12/2016 |
| JP | 2018-092668 A  | 6/2018  |
| KR | 2013-0115131 A | 10/2013 |
| WO | WO-2005/098955 | 10/2005 |

OTHER PUBLICATIONS

Written Opinion (Application No. PCT/IB2019/050173) dated Apr. 2, 2019.
Chinese Office Action (Application No. 201980007719.9) dated Oct. 8, 2021.

\* cited by examiner

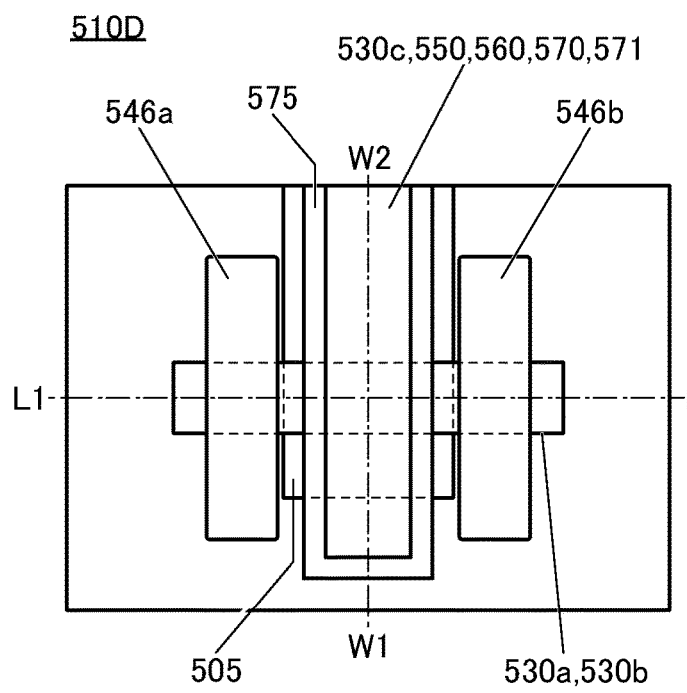
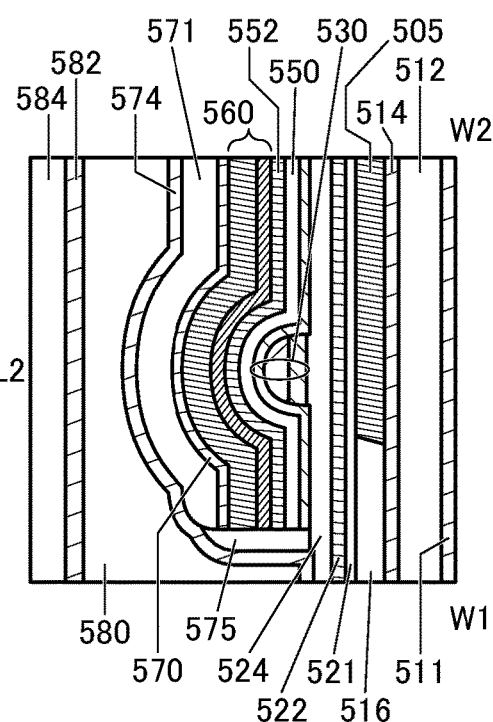
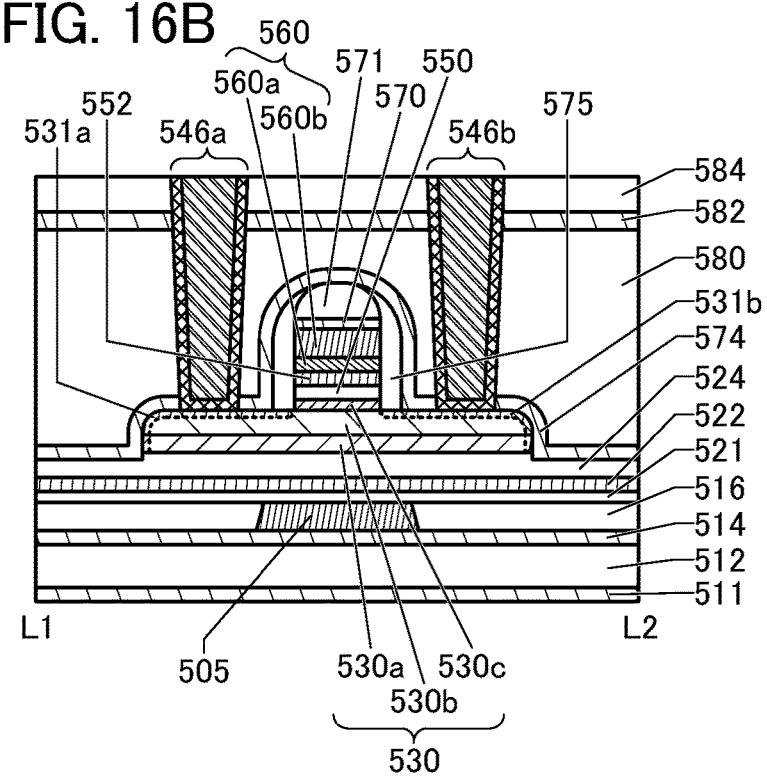

SEMICONDUCTOR DEVICE, ELECTRONIC COMPONENT, AND ELECTRONIC DEVICE

CROSS REFERENCE TO RELATED APPLICATIONS

This application is a U.S. National Phase Application under 35 U.S.C. § 371 of International Application PCT/IB32019/050173, filed on Jan. 10, 2019, which is incorporated by reference and claims the benefit of a foreign priority application filed in Japan on Jan. 24, 2018, as Application No. 2018-009327.

TECHNICAL FIELD

One embodiment of the present invention relates to a display device, an electronic component, and an electronic device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition (composition of matter). Therefore, specific examples of the technical field of one embodiment of the present invention disclosed in this specification include a semiconductor device, a display device, a liquid crystal display device, a light-emitting device, a power storage device, an imaging device, a memory device, a processor, an electronic device, a system, a driving method thereof, a manufacturing method thereof, and a testing method thereof.

BACKGROUND ART

In recent years, a reduction in power consumption of an electronic device in operation has been highly required. In order to reduce power consumption of an electronic device, an operation of each circuit is controlled in accordance with an operation state of a signal processing circuit.

In a semiconductor device such as a voltage regulator, which is an example of a signal processing circuit, an operation with a high power supply rejection ratio and favorable transient response characteristics by a three-stage structure of a first differential amplifier circuit, a second differential amplifier circuit, and an output transistor and an operation suitable for low current consumption by a two-stage structure of the second differential amplifier circuit and the output transistor are automatically switched (see Patent Document 1).

Furthermore, a reference voltage generation circuit included in the semiconductor device or the like keeps consuming power as long as it generates a reference voltage. Patent Document 2 discloses the invention of a semiconductor device which can be driven even when supply of a reference voltage is stopped, by electrical connection of a holding circuit for holding a potential to an output of a reference voltage generation circuit.

REFERENCES

Patent Documents

[Patent Document 1] Japanese Published Patent Application No. 2011-96210
[Patent Document 2] Japanese Published Patent Application No. 2013-235564

SUMMARY OF THE INVENTION

Problems to be Solved by the Invention

However, since the semiconductor device disclosed in Patent Document 2 can use only a current source with a designed current amount, it is difficult to adjust the start-up time and power consumption of the semiconductor device by adjusting the amount of current flowing from the current source. Moreover, even if the amount of current flowing from the current source can be adjusted, a potential held in the holding circuit needs to be rewritten, which requires restart of the semiconductor device.

An object of one embodiment of the present invention is to provide a novel semiconductor device. In addition, an object of one embodiment of the present invention is to provide a novel electronic device including the semiconductor device.

An object of one embodiment of the present invention is to provide a semiconductor device with reduced power consumption. An object of one embodiment of the present invention is to provide a semiconductor device capable of increasing or decreasing start-up time.

Note that objects of one embodiment of the present invention are not limited to the objects listed above. The objects listed above do not preclude the existence of other objects. The other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and the other objects. Note that one embodiment of the present invention does not necessarily solve all the objects listed above and the other objects.

Means for Solving the Problems (1)

One embodiment of the present invention is a semiconductor device including first to third circuits and a first holding circuit. The first holding circuit includes a first holding portion. The first holding circuit has a function of bringing the first holding portion into an electrically floating state to hold a first potential of the first holding portion. The first circuit has a function of changing the first potential of the first holding portion to a second potential. The second circuit has a function of generating a bias current based on the first potential or the second potential of the first holding portion. The third circuit includes a first terminal to a third terminal. The third circuit has a function of generating a third potential in accordance with an input potential to the second terminal of the third circuit by supply of the bias current to the first terminal of the third circuit and outputting the third potential from the third terminal of the third circuit.

(2)

In the above structure (1), in the semiconductor device of one embodiment of the present invention, the first circuit includes a first capacitor. A first terminal of the first capacitor is electrically connected to the first holding portion. The first circuit has a function of changing the first potential held in the first holding portion to the second potential by capacitive coupling of the first capacitor when a fourth potential is input to a second terminal of the first capacitor after the first holding circuit brings the first holding portion into an electrically floating state.

(3)

In the above structure (2), in the semiconductor device of one embodiment of the present invention, the first circuit includes a buffer circuit. An output terminal of the buffer circuit is electrically connected to the second terminal of the first capacitor.

(4)

In the above structure (2), in the semiconductor device of one embodiment of the present invention, the first circuit includes a multiplexer. An output terminal of the multiplexer is electrically connected to the second terminal of the first capacitor.

(5)

In the above structure (2), in the semiconductor device of one embodiment of the present invention, the first circuit includes a comparator. An output terminal of the comparator is electrically connected to the second terminal of the first capacitor. The third potential is input to a first input terminal of the comparator. A fifth potential is input to a second input terminal of the comparator.

(6)

In any one of the above structures (1) to (5), in the semiconductor device of one embodiment of the present invention, the first holding circuit includes a first transistor and a second capacitor. The first holding portion is electrically connected to a first terminal of the first transistor and a first terminal of the second capacitor. The first transistor includes a metal oxide in a channel formation region.

(7)

In the above structure (6), the semiconductor device of one embodiment of the present invention includes a fourth circuit. The fourth circuit has a function of allowing a constant current to flow. The fourth circuit is electrically connected to a second terminal of the first transistor. When the first transistor is in a conduction state, the first potential in accordance with the constant current is input to the first terminal of the first transistor.

(8)

In any one of the above structures (1) to (7), the semiconductor device of one embodiment of the present invention includes a second holding circuit. The second holding circuit includes a second holding portion. The second holding portion is electrically connected to the second terminal of the third circuit. The second holding circuit has a function of bringing the second holding portion into an electrically floating state to hold an input potential to the second terminal of the third circuit.

(9)

In the above structure (8), in the semiconductor device of one embodiment of the present invention, the second holding circuit includes a second transistor and a third capacitor. The second holding portion is electrically connected to a first terminal of the second transistor and a first terminal of the third capacitor. An input potential is input to a second terminal of the second transistor. The second transistor includes a metal oxide in a channel formation region.

(10)

One embodiment of the present invention is an electronic component in which the semiconductor device having any one of the above structures (1) to (9) and an integrated circuit are provided over a printed circuit board.

(11)

One embodiment of the present invention is an electronic device including the semiconductor device having any one of the above structures (1) to (9) and a housing.

Effect of the Invention

One embodiment of the present invention can provide a novel semiconductor device. In addition, one embodiment of the present invention can provide an electronic device including the semiconductor device.

Furthermore, one embodiment of the present invention can provide a semiconductor device with reduced power consumption. One embodiment of the present invention can provide a semiconductor device capable of increasing and decreasing the start-up time.

Note that the effects of one embodiment of the present invention are not limited to the effects listed above. The effects listed above do not preclude the existence of other effects. The other effects are effects that are not described in this section and will be described below. The other effects that are not described in this section will be derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIGS. 16A to 16C A top view and cross-sectional views illustrating a structure example of a transistor.

MODE FOR CARRYING OUT THE INVENTION

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a channel formation region of a transistor, the metal oxide is called an oxide semiconductor in some cases. That is, when a metal oxide can form a channel formation region of a transistor that has at least one of an amplifying function, a rectifying function, and a switching function, the metal oxide can be referred to as an oxide semiconductor (OS). Moreover, when an OS FET or an OS transistor is described, it can also be referred to as a transistor including a metal oxide or an oxide semiconductor.

Furthermore, in this specification and the like, a metal oxide containing nitrogen is in some cases also collectively referred to as a metal oxide. A metal oxide containing nitrogen may be referred to as a metal oxynitride.

Embodiment 1

In this embodiment, a semiconductor device of one embodiment of the present invention is described.

Structure Example

Figure 1:
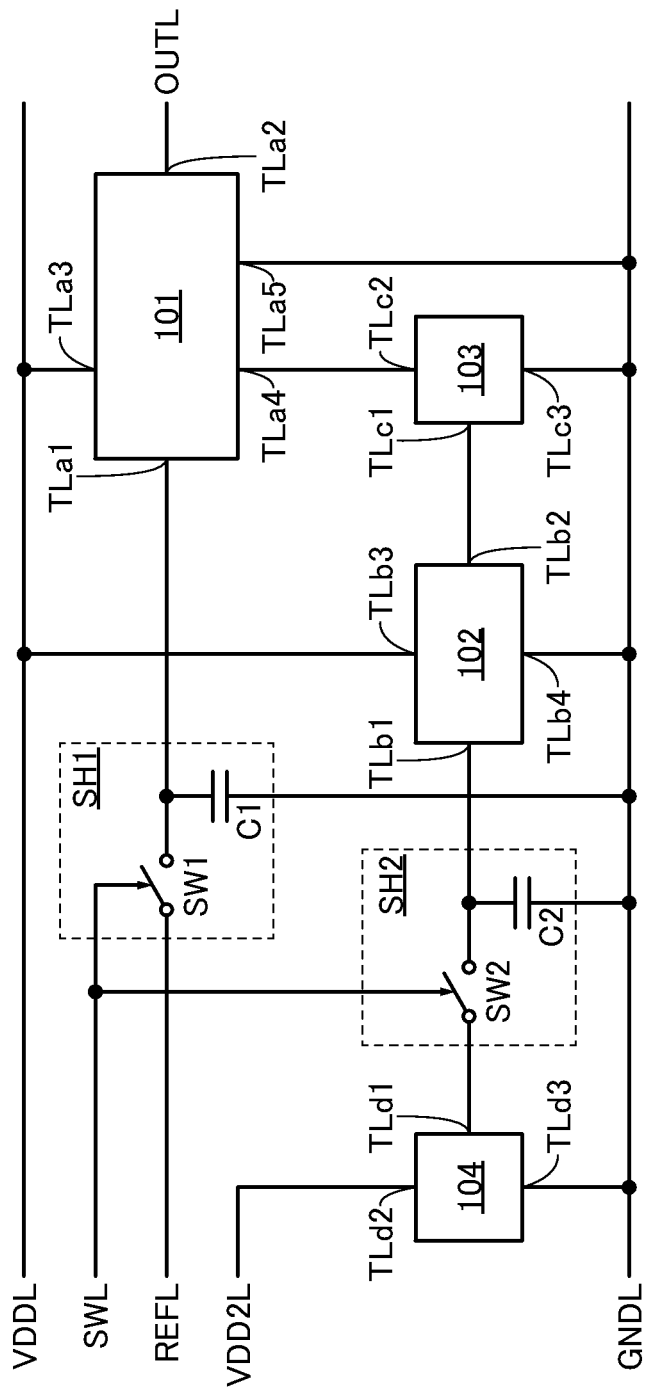
FIG. 1 A block diagram illustrating a structure example of a semiconductor device.

FIG. 1 is a block diagram illustrating an example of a semiconductor device of one embodiment of the present invention. A semiconductor device 100 is a voltage regulator that outputs a potential in accordance with a reference potential from a wiring OUTL when the reference potential is input from a wiring REFL. The semiconductor device 100 includes a circuit 101, a regulator circuit 102, a circuit 103, a circuit 104, a holding circuit SH1, and a holding circuit SH2.

The circuit 101 includes a terminal TLa1 to a terminal TLa5. The terminal TLa1 is electrically connected to the holding circuit SH1, the terminal TLa2 is electrically connected to the wiring OUTL, the terminal TLa3 is electrically connected to a wiring VDDL, and the terminal TLa5 is electrically connected to a wiring GNDL. The terminal TLa4 is electrically connected to a terminal TLc2 of the circuit 103 to be described later.

The wiring VDDL is a wiring for supplying a high power supply potential to the semiconductor device 100, and the wiring GNDL is a wiring for supplying a low power supply potential to the semiconductor device 100. Note that the low power supply potential can be, for example, a ground potential.

The circuit 101 has a function of generating an output potential in accordance with a potential input to the terminal TLa1 by supply of a bias current to the terminal TLa4, and outputting the output potential from the terminal TLa2. Therefore, the circuit 101 can include, for example, a circuit having a differential pair, an amplifier circuit that can be driven by supply of a bias current, or the like.

The circuit 103 includes a terminal TLc1 to a terminal TLc3. The terminal TLc1 is electrically connected to a terminal TLb2 of the regulator circuit 102 to be described later, and the terminal TLc3 is electrically connected to the wiring GNDL.

The circuit 103 is a circuit for generating the bias current to be input to the circuit 101. Note that the amount of the bias current is determined in accordance with a potential input to the terminal TLc1.

The regulator circuit 102 includes a terminal TLb1 to a terminal TLb4. The terminal TLb1 is electrically connected to the holding circuit SH2, the terminal TLb3 is electrically connected to the wiring VDDL, and the terminal TLb4 is electrically connected to the wiring GNDL.

The regulator circuit 102 is a circuit having a function of changing potentials of the terminal TLb1 and the terminal TLb2. With the circuit structure in FIG. 1, by changing the potentials of the terminal TLb1 and the terminal TLb2, a potential input to the terminal TLc1 of the circuit 103 and a potential of a first terminal of a capacitor C2 included in the holding circuit SH2 can also be changed simultaneously. In addition, the potential input to the terminal TLc1 of the circuit 103 can be changed by changing the potentials of the terminal TLb1 and the terminal TLb2; consequently, the amount of the bias current generated in the circuit 103 can be increased or decreased.

The circuit 104 includes a terminal TLd1 to a terminal TLd3. The terminal TLd1 is electrically connected to the holding circuit SH2, the terminal TLd2 is electrically connected to a wiring VDD2L, and the terminal TLd3 is electrically connected to the wiring GNDL.

The wiring VDD2L is a wiring for supplying a predetermined potential to the circuit 104. The potential may be equal to the high power supply potential of the wiring VDDL. Therefore, the terminal TLd2 may be electrically connected to not the wiring VDD2L but the wiring VDDL.

The circuit 104 functions as a circuit for inputting a predetermined potential to the first terminal of the capacitor C2 of the holding circuit SH2 and the terminal TLb1 of the regulator circuit 102.

The holding circuit SH1 includes a switch SW1 and a capacitor C1. A first terminal of the switch SW1 is electrically connected to the wiring REFL, and a second terminal of the switch SW1 is electrically connected to a first terminal of the capacitor C1 and the terminal TLa1. A second terminal of the capacitor C1 is electrically connected to the wiring GNDL.

A control terminal of the switch SW1 is electrically connected to a wiring SWL. The wiring SWL is a wiring having a function of transmitting a control signal for switching an on state and an off state of the switch SW1.

The holding circuit SH2 includes a switch SW2 and the capacitor C2. A first terminal of the switch SW2 is electrically connected to the terminal TLd1, and a second terminal of the switch SW2 is electrically connected to the first terminal of the capacitor C2 and the terminal TLb1. A second terminal of the capacitor C2 is electrically connected to the wiring GNDL.

A control terminal of the switch SW2 is electrically connected to the wiring SWL. Thus, the switch SW1 and the switch SW2 switch the on state and the off state in synchronization with each other on the basis of the control signal transmitted from the wiring SWL. Specifically, with such a structure, the switch SW1 and the switch SW2 can be brought into the on state or the off state simultaneously.

As the switch SW1 and the switch SW2 described in this specification, for example, transistors can be used, and gates of the transistors can be the control terminals of the switch SW1 and the switch SW2. In the case where transistors are used as the switch SW1 and the switch SW2, OS transistors are preferably used. In particular, an OS transistor preferably includes a metal oxide containing at least one of indium, an element M (the element M is aluminum, gallium, yttrium, or tin), and zinc in a channel formation region. The metal oxide will be described in detail in Embodiment 3. The use of such an OS transistor as the switch SW1 (the switch SW2) enables the off-state current of the transistor to be extremely low. Thus, in the case where a potential is held in the first terminal of the capacitor C1 (the first terminal of the capacitor C2), the use of an OS transistor as the switch SW1 (the switch SW2) can prevent variation in the potential held in the capacitor C1 (the capacitor C2) due to the off-state current.

Although FIG. 1 illustrates a structure in which the wiring SWL is electrically connected to each of the control terminal of the switch SW1 and the control terminal of the switch SW2, the semiconductor device of one embodiment of the present invention may have a structure in which different wirings are electrically connected to the control terminal of the switch SW1 and the control terminal of the switch SW2. With this structure, the switch SW1 and the switch SW2 can independently switch the on state and the off state.

The holding circuit SH1 can hold the potential of the first terminal of the capacitor C1. Specifically, in the case where the terminal TLa1 is not electrically connected to a wiring supplied with a potential such as a power supply potential in the circuit 101, a potential input from the wiring REFL can be written to the first terminal of the capacitor C1 when the switch SW1 is in an on state, and then the potentials of the first terminal of the capacitor C1 and the terminal TLa1 of the circuit 101 can be held by bringing the switch SW1 into an off state. Similarly, in the case where a wiring supplied with a potential such as a power supply potential is not electrically connected between the terminal TLb1 and the terminal TLb2 in the regulator circuit 102 and to the terminal TLc1 in the circuit 103, in the holding circuit SH2, a potential input from the terminal TLd1 of the circuit 104 is written to the first terminal of the capacitor C2 when the switch SW2 is in an on state, and then, the potential of the first terminal of the capacitor C2 can be held by bringing the switch SW2 into an off state.

<<Circuit 101, Circuit 103>>

Figure 2:
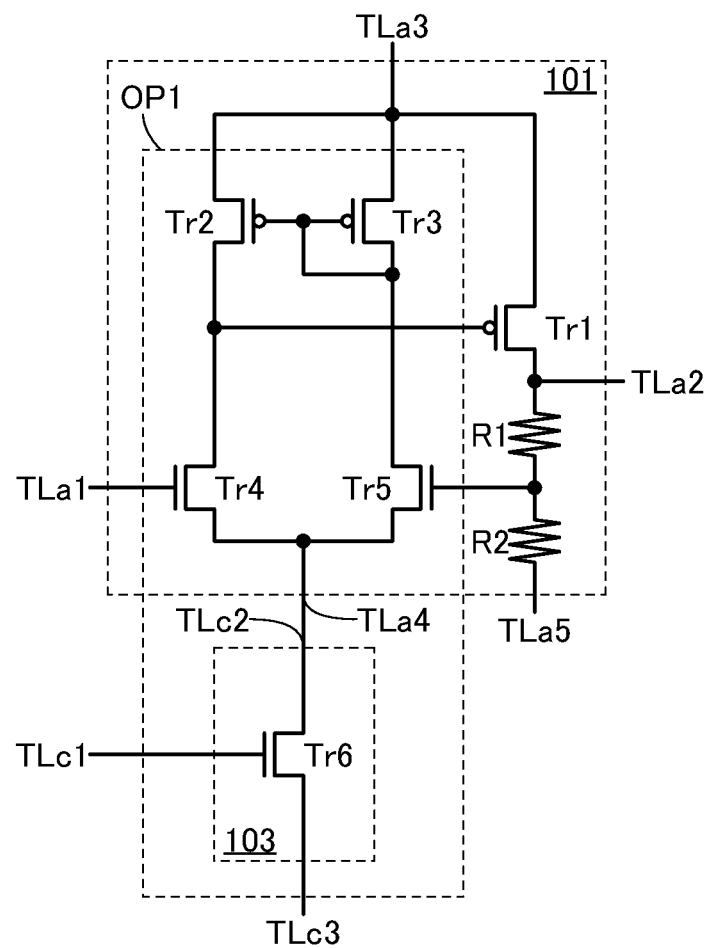
FIG. 2 A circuit diagram illustrating a structure example of a circuit included in a semiconductor device.

Next, the circuit structures of the circuit 101 and the circuit 103 are described. FIG. 2 illustrates examples of the circuit structures of the circuit 101 and the circuit 103.

The circuit 101 illustrated in FIG. 2 includes some of circuit elements included in an operational amplifier OP1, a transistor Tr1, a resistor R1, and a resistor R2. Note that the transistor Tr1 is a p-channel transistor. Furthermore, the operational amplifier OP1 includes a transistor Tr2 to a transistor Tr6. Note that the transistor Tr2 and the transistor Tr3 are p-channel transistors, and the transistor Tr4 to the transistor Tr6 are n-channel transistors. The circuit 103 illustrated in FIG. 2 includes the transistor Tr6. In other words, in the examples of the circuit structures of the circuit 101 and the circuit 103 illustrated in FIG. 2, the operational amplifier OP1 is formed of some of circuit elements of the circuit 101 and the circuit 103. In this case, the operational amplifier OP1 functions as an amplifier circuit that has a function of generating a bias current and a function of generating an output potential in accordance with a potential input to a differential pair (gates of the transistor Tr4 and the transistor Tr5) by the bias current.

A first terminal of the transistor Tr2 is electrically connected to the terminal TLa3, a second terminal of the transistor Tr2 is electrically connected to a gate of the transistor Tr1 and a first terminal of the transistor Tr4, and a gate of the transistor Tr2 is electrically connected to a gate of the transistor Tr3 and a second terminal of the transistor Tr3. A first terminal of the transistor Tr3 is electrically connected to the terminal TLa3, and the second terminal of the transistor Tr3 is electrically connected to a first terminal of the transistor Tr5.

A second terminal of the transistor Tr4 is electrically connected to the terminal TLa4, and the gate of the transistor Tr4 is electrically connected to the terminal TLa1. A second terminal of the transistor Tr5 is electrically connected to the terminal TLa4, and the gate of the transistor Tr5 is electrically connected to a first terminal of the resistor R1 and a first terminal of the resistor R2. A first terminal of the transistor Tr6 is electrically connected to the terminal TLc2, a second terminal of the transistor Tr6 is electrically connected to the terminal TLc3, and a gate of the transistor Tr6 is electrically connected to the terminal TLc1.

In other words, the gate of the transistor Tr4 corresponds to an inverting input terminal of the operational amplifier OP1, the gate of the transistor Tr5 corresponds to a non-inverting input terminal of the operational amplifier OP1, the first terminal of the transistor Tr2 and the first terminal of the transistor Tr3 correspond to a high power supply potential input terminal of the operational amplifier OP1, and the second terminal of the transistor Tr6 corresponds to a low power supply potential input terminal of the operational amplifier OP1.

A first terminal of the transistor Tr1 is electrically connected to the terminal TLa3. The terminal TLa2 is electrically connected to a second terminal of the transistor Tr1 and a second terminal of the resistor R1. The terminal TLa5 is electrically connected to a second terminal of the resistor R2.

The resistor R1 and the resistor R2 have a function of generating a feedback potential applied to the transistor Tr5. Thus, a circuit element such as a transistor or a diode can be used instead of the resistor R1 and/or the resistor R2.

The circuit 101 and the circuit 103 have the circuit structures illustrated in FIG. 2, whereby, by inputting a reference potential to the inverting input terminal of the operational amplifier OP1 from the wiring REFL, a voltage in accordance with the reference potential can be generated in the circuit 101 and output from the terminal TLa2.

Note that in the operational amplifier OP1 illustrated in FIG. 2, a current mirror circuit is formed using the terminal TLa3 supplying the high power supply potential, the transistor Tr2, and the transistor Tr3, and a differential circuit is formed using the transistor Tr4 and the transistor Tr5. Therefore, the transistor Tr2 and the transistor Tr3 preferably have similar structures and sizes and the transistor Tr4 and the transistor Tr5 preferably have similar structures and sizes.

Next, specific operations of the circuit 101 and the circuit 103 are described.

Since the current mirror circuit is formed using the terminal TLa3 supplying the high power supply potential, the transistor Tr2, and the transistor Tr3, a current in accordance with a potential of the second terminal of the transistor Tr3 flows between a source and a drain of each of the transistor Tr2 and the transistor Tr3.

The potential of the second terminal of the transistor Tr3 is determined in accordance with a potential of the gate of the transistor Tr5. Specifically, a current flows between a source and a drain of the transistor Tr5 in accordance with the potential of the gate of the transistor Tr5 and a potential supplied from the terminal TLa4, so that the potential of the second terminal of the transistor Tr3 is a potential in accordance with the current.

Here, when a reference potential is input to the gate of the transistor Tr4 (i.e., the terminal TLa1), a current flowing between a source and a drain of the transistor Tr4 is determined in accordance with the reference potential and the potential supplied from the terminal TLa4.

At this time, in the case where the potential of the gate of the transistor Tr5 is higher than the reference potential, the source-drain current of the transistor Tr5 is larger than the source-drain current of the transistor Tr4; thus, the potential of the second terminal of the transistor Tr2 (the gate of the transistor Tr1) is increased. The first terminal of the transistor Tr1 is electrically connected to the terminal TLa3 supplying the high power supply potential; thus, when the potential of the gate of the transistor Tr1 is increased, the source-drain current of the transistor Tr1 is decreased, and the potential of the second terminal of the transistor Tr1 is decreased because the second terminal of the transistor Tr1 is electrically connected, through the resistor R1 and the resistor R2, to the terminal TLa5 supplying the low power supply potential. Thus, the potential of the gate of the transistor Tr5 is also decreased, so that the source-drain current of the transistor Tr5 is decreased. Finally, the potential of the gate of the transistor Tr5 converges to a potential that makes the source-drain current of the transistor Tr5 substantially equal to the source-drain current of the transistor Tr4. That is, the potential of the gate of the transistor Tr5 is substantially equal to the reference potential.

In the case where the potential of the gate of the transistor Tr5 is lower than the reference potential, the source-drain current of the transistor Tr4 is larger than the source-drain current of the transistor Tr5; thus, the potential of the second terminal of the transistor Tr2 (the gate of the transistor Tr1) is decreased. The first terminal of the transistor Tr1 is electrically connected to the terminal TLa3 supplying the high power supply potential; thus, when the potential of the gate of the transistor Tr1 is decreased, the source-drain current of the transistor Tr1 is increased and the potential of the second terminal of the transistor Tr1 is increased. Thus, the potential of the gate of the transistor Tr5 is also increased, so that the source-drain current of the transistor Tr5 is increased. Finally, the potential of the gate of the transistor Tr5 converges to a potential that makes the source-drain current of the transistor Tr5 substantially equal to the source-drain current of the transistor Tr4. That is, the potential of the gate of the transistor Tr5 is substantially equal to the reference potential.

Here, the potential output from the terminal TLa2 is determined by the resistance values of the resistor R1 and the resistor R2 as well as the reference potential input to the terminal TLa1. In other words, the resistance values of the resistor R1 and the resistor R2 are determined, whereby the potential output from the terminal TLa2 can be set to a given value. In the case where a potential substantially equal to the reference potential input to the terminal TLa1 is intended to be output from the terminal TLa2, the resistor R1 is set to as close to 0 as possible.

<<Regulator Circuit 102>>

Figure 3A:
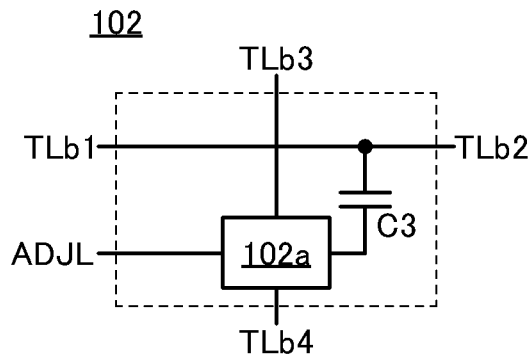
FIGS. 3A to 3H Circuit diagrams each illustrating a structure example of a circuit included in a semiconductor device.

Next, a circuit structure of the regulator circuit 102 is described. FIG. 3(A) illustrates an example of the circuit structure of the regulator circuit 102.

The regulator circuit 102 illustrated in FIG. 3(A) includes a circuit 102a and a capacitor C3.

A first terminal of the capacitor C3 is electrically connected to the terminal TLb1 and the terminal TLb2. A second terminal of the capacitor C3 is electrically connected to an output terminal of the circuit 102a. An input terminal of the circuit 102a is electrically connected to a wiring ADJL, a high power supply potential input terminal of the circuit 102a is electrically connected to the terminal TLb3, and a low power supply potential input terminal of the circuit 102a is electrically connected to the terminal TLb4.

The wiring ADJL is a wiring for supplying an input potential to the circuit 102a, and the circuit 102a is a circuit having a function of applying a potential in accordance with the input potential to the second terminal of the capacitor C3. In other words, the regulator circuit 102 has a circuit structure in which, when the wiring electrically connected to the terminal TLb1 and the terminal TLb2 is in an electrically floating state, the potential of the wiring electrically connected to the terminal TLb1 and the terminal TLb2 can be changed by capacitive coupling of the capacitor C3 with application of a potential to the second terminal of the capacitor C3. Note that the regulator circuit 102 may have a structure in which the circuit 102a is omitted, i.e., the wiring ADJL is directly electrically connected to the second terminal of the capacitor C3 (not illustrated).

Figure 3B:
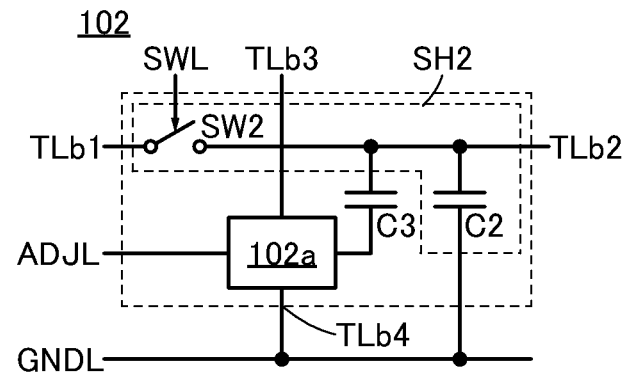

The regulator circuit 102 may have a structure including the holding circuit SH2 of the semiconductor device 100 illustrated in FIG. 1. FIG. 3(B) illustrates such a circuit structure. The regulator circuit 102 in FIG. 3(B) is an integrated circuit of the regulator circuit 102 and the holding circuit SH2 of the semiconductor device 100 illustrated in FIG. 1, which has a function of holding the potential of the first terminal of the capacitor C2 (the first terminal of the capacitor C3) in addition to the function of changing the potential of the first terminal of the capacitor C3 by capacitive coupling of the capacitor C3 of the regulator circuit 102 in FIG. 3(A).

Figure 3C:
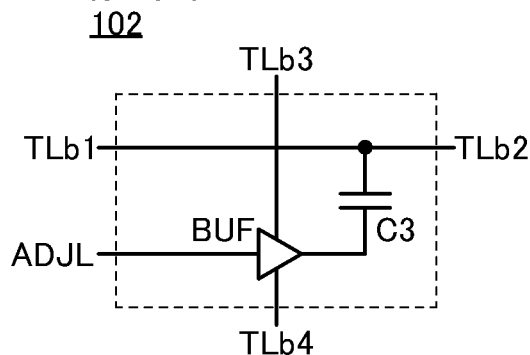

As the circuit 102a, a buffer circuit BUF can be used as illustrated in FIG. 3(C), for example. In this case, an input terminal of the buffer circuit BUF corresponds to the input terminal of the circuit 102a, and an output terminal of the buffer circuit BUF corresponds to the output terminal of the circuit 102a. A high power supply input terminal of the buffer circuit BUF is electrically connected to the terminal TLb3, and a low power supply input terminal of the buffer circuit BUF is electrically connected to the terminal TLb4. Note that a digital buffer circuit, an analog buffer circuit, or the like can be used as the buffer circuit BUF.

Figure 3D:
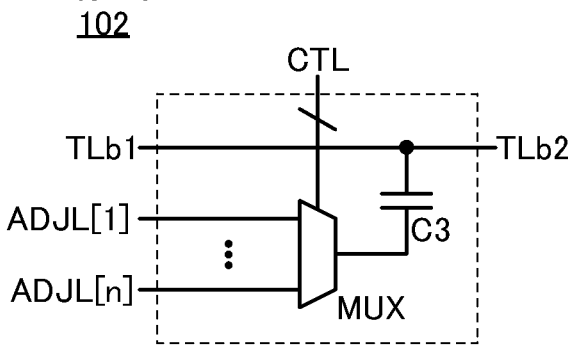

Alternatively, the circuit 102a may have a structure in which one of a plurality of potentials is applied to the second terminal of the capacitor C3. FIG. 3(D) illustrates such a circuit structure. A multiplexer MUX is used as the circuit 102a in the regulator circuit 102 illustrated in FIG. 3(D). The multiplexer includes n (n is an integer greater than or equal to 2) input terminals, and the n input terminals are electrically connected to a wiring ADJL[1] to a wiring ADJL[n], respectively. Note that in the case of the regulator circuit 102 in FIG. 3(D), the terminal TLb3 and the terminal TLb4 are not necessarily provided.

The wiring ADJL[1] to the wiring ADJL[n] are wirings for supplying different potentials. A wiring CTL is electrically connected to the multiplexer MUX and is a wiring for transmitting a selection signal to the multiplexer MUX. The multiplexer MUX has a function of selecting one of the n input terminals of the multiplexer MUX in accordance with the selection signal by receiving the selection signal and electrically connecting the selected input terminal to the output terminal. With such a structure, the multiplexer MUX can select one of the wiring ADJL[1] to the wiring ADJL[n] and apply the potential supplied by the selected wiring to the second terminal of the capacitor C3. Although the wiring CTL is illustrated as including a plurality of wirings in FIG. 3(D), the wiring CTL can be one wiring in the case where n is 2.

Figure 3E:
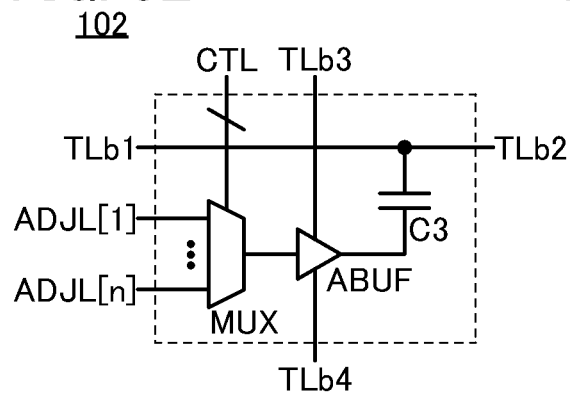
Figure 3F:
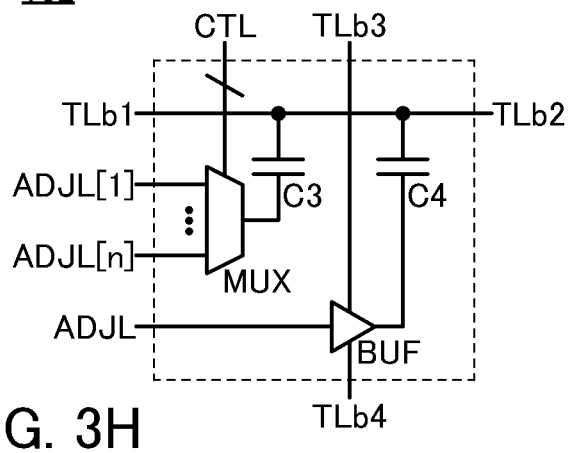

A circuit may be employed in which an analog buffer circuit ABUF is provided between the output terminal of the multiplexer MUX and the second terminal of the capacitor C3. In this case, as illustrated in FIG. 3(E), the circuit may have a structure in which the output terminal of the multiplexer MUX and an input terminal of the analog buffer circuit ABUF are electrically connected to each other, and an output terminal of the analog buffer circuit ABUF and the second terminal of the capacitor C3 are electrically connected to each other. Alternatively, the regulator circuit 102 in FIG. 3(C) and the regulator circuit 102 in FIG. 3(D) may be combined. In this case, as illustrated in FIG. 3(F), a structure may be employed in which the first terminal of the capacitor C3 and a first terminal of a capacitor C4 are electrically connected to the wiring between the terminal TLb1 and the terminal TLb2 in parallel, the output terminal of the multiplexer MUX is electrically connected to the second terminal of the capacitor C3, and the output terminal of the buffer circuit BUF is electrically connected to a second terminal of the capacitor C4.

Figure 3G:
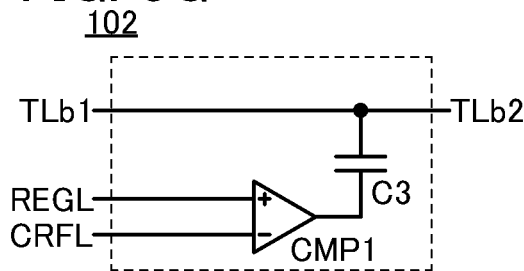

Alternatively, the circuit 102*a* may have a structure in which the potential supplied to the second terminal of the capacitor C3 is changed in accordance with the potential output from the terminal TLa2 of the circuit 101. FIG. 3(G) illustrates such a circuit structure. A comparator CMP1 is used as the circuit 102*a* in the regulator circuit 102 illustrated in FIG. 3(G). A non-inverting input terminal of the comparator CMP1 is electrically connected to a wiring REGL, an inverting input terminal of the comparator CMP1 is electrically connected to a wiring CRFL, and an output terminal of the comparator CMP1 is connected to the second terminal of the capacitor C3. Note that a power supply potential input terminal of the comparator CMP1 may be electrically connected to the terminal TLb3 and/or the terminal TLb4, or may be electrically connected to a terminal supplying a power supply potential that is other than the terminals TLb3 and TLb4.

A potential output from the terminal TLa2 of the circuit 101 is input to the wiring REGL. A reference potential in the comparator CMP1 is input to the wiring CRFL.

In the regulator circuit 102 illustrated in FIG. 3(G), when the potential of the wiring REGL is lower than the potential of the wiring CRFL, that is, when the potential output from the terminal TLa2 of the circuit 101 is lower than the reference potential, the output terminal of the comparator CMP1 outputs a high-level potential. At this time, the high-level potential is supplied to the second terminal of the capacitor C3. When the wiring electrically connected to the terminal TLb1 and the terminal TLb2 is in an electrically floating state, the potential of the wiring is increased because of capacitive coupling of the capacitor C3.

When the potential of the wiring REGL is higher than the reference potential of the wiring CRFL, that is, when the potential output from the terminal TLa2 of the circuit 101 is higher than the reference potential, the output terminal of the comparator CMP1 outputs a low-level potential. When the wiring electrically connected to the terminal TLb1 and the terminal TLb2 is in an electrically floating state, the potential of the wiring is decreased because of capacitive coupling of the capacitor C3.

Note that the operation of the semiconductor device 100 in the case of using the regulator circuit 102 illustrated in FIG. 3(G) is described in detail in an operation example.

Figure 3H:
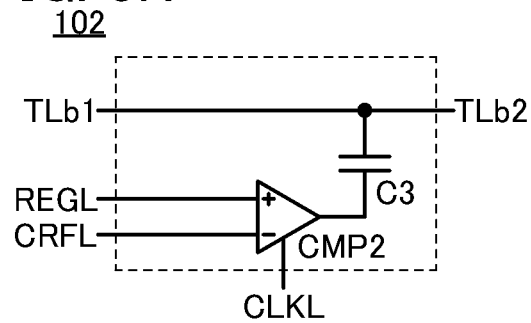

A clocked comparator CMP2 can be used instead of the comparator CMP1. The regulator circuit 102 in FIG. 3(H) has a circuit structure in which the clocked comparator CMP2 is used as the compactor CMP1 of the regulator circuit 102 in FIG. 3(G), and a wiring CLKL for supplying a clock signal is electrically connected to a clock signal input terminal of the clocked comparator CMP2.

Alternatively, the regulator circuit 102 may have a circuit structure in which a plurality of circuits 102*a* and a plurality of capacitors C3 are included. Specifically, the regulator circuit 102 may have a circuit structure illustrated in FIG. 4(A). The regulator circuit 102 illustrated in FIG. 4(A) includes a circuit 102*a*[1] to a circuit 102*a*[n] as the plurality of circuits 102*a* and a capacitor C3[1] to a capacitor C3[n] as the plurality of capacitors C3.

A first terminal of the capacitor C3[j] (j is an integer greater than or equal to 1 and less than or equal to n) is electrically connected to the terminal TLb1 and the terminal TLb2. A second terminal of the capacitor C3[j] is electrically connected to an output terminal of the circuit 102*a*[j]. An input terminal of the circuit 102*a*[j] is electrically connected to the wiring ADJL[j], a high power supply potential input terminal of the circuit 102*a*[j] is electrically connected to the terminal TLb3, and a low power supply potential input terminal of the circuit 102*a*[j] is electrically connected to the terminal TLb4.

With such a structure, the potential of the wiring electrically connected to the terminal TLb1 and the terminal TLb2 can be changed by the circuit 102*a*[1] to the circuit 102*a*[n] and the capacitor C3[1] to the capacitor C3[n]. One or more of the circuit 102*a*[1] to the circuit 102*a*[n] are selected as circuits to be driven, whereby the potential of the wiring electrically connected to the terminal TLb1 and the terminal TLb2 can be changed variously.

For example, when the capacitance values of the capacitor C3[1] to the capacitor C3[n] are substantially equal and the potential supplied by the wiring ADJL[j] is $2^{j-1} \times V_{any}$ ($V_{any}$ is a given potential), by selecting one or more of the circuit 102*a*[1] to the circuit 102*a*[n] as the circuits to be driven, a total potential of $k \times V_{any}$ (k is an integer greater than or equal to 0 and less than or equal to $2^n-1$) can be supplied to the second terminals of the capacitor C3[1] to the capacitor C3[n]. That is, the potential of the wiring electrically connected to the terminal TLb1 and the terminal TLb2 can be changed in accordance with the total potential.

Alternatively, for example, when each of the potentials supplied by the wiring ADJL[1] to the wiring ADJL[n] is $V_{any}$ and the capacitance values of the capacitor C3[1] to the capacitor C3[n] are different values, by selecting one or more of the circuit 102*a*[1] to the circuit 102*a*[n] as the circuits to be driven, the potential of the wiring electrically connected to the terminal TLb1 and the terminal TLb2 can be changed variously.

Figure 4A:
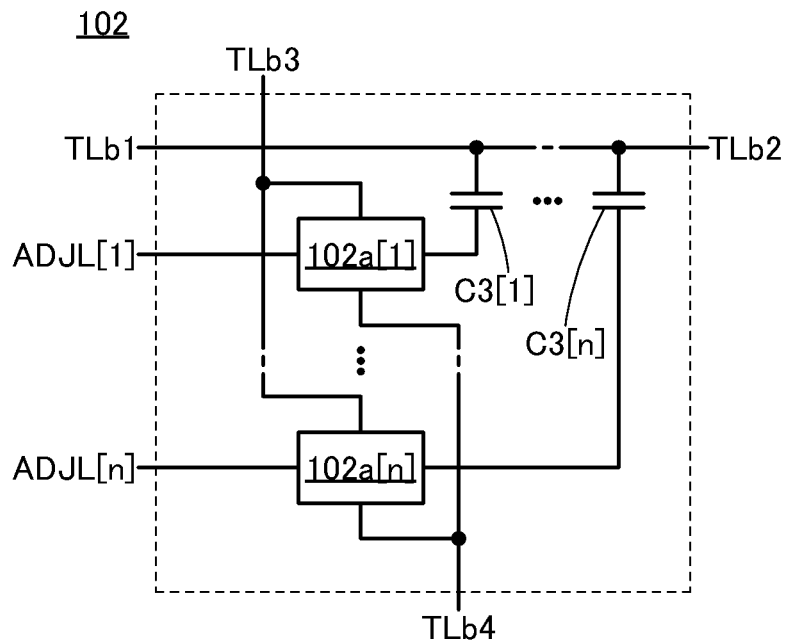
FIGS. 4A and 4B Circuit diagrams each illustrating a structure example of a circuit included in a semiconductor device.

In the structure of the regulator circuit 102 illustrated in FIG. 4(A), only the terminal TLb1, the terminal TLb2, the terminal TLb3, the terminal TLb4, the wiring ADJL[1], the wiring ADJL[n], the capacitor C3[1], the capacitor C3[n], the circuit 102*a*[1], and the circuit 102*a*[n] are illustrated, and other circuits, elements, wirings, and the like are omitted.

Figure 4B:
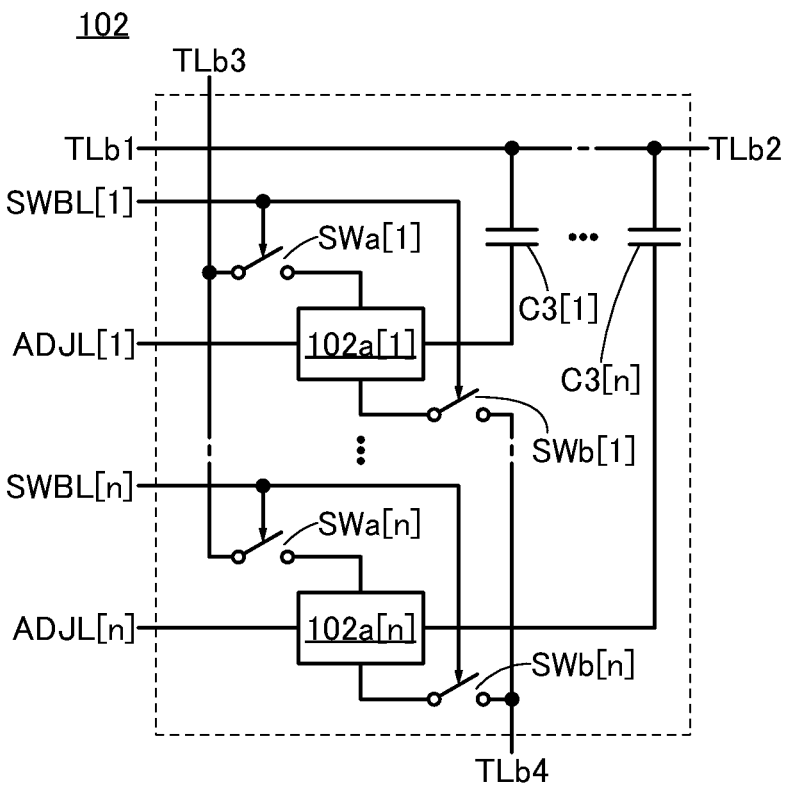

Alternatively, the regulator circuit 102 illustrated in FIG. 4(A) may have a structure in which one or some of the circuit 102*a*[1] to the circuit 102*a*[n] are selected and power supply to the selected circuit(s) is stopped. FIG. 4(B) illustrates such a circuit structure. The regulator circuit 102 illustrated in FIG. 4(B) has a structure in which a switch SWa[1] to a switch SWa[n] are provided between the terminal TLb3 for supplying the high power supply potential and high power supply potential input terminals of the circuit 102a[1] to the circuit 102a[n], and a switch SWb[1] to a switch SWb[n] are provided between the terminal TLb4 for supplying the low power supply potential and low power supply potential input terminals of the circuit 102a[1] to the circuit 102a[n]. A wiring SWBL[1] to a wiring SWBL[n] are electrically connected to the switch SWa[1] to the switch SWa[n], respectively, and the wiring SWBL[1] to the wiring SWBL[n] are electrically connected to the switch SWb[1] to the switch SWb[n], respectively. The on state and the off state of the switch SWa[j] and the switch SWb[j] are switched by a signal transmitted from the wiring SWBL[j]. When the regulator circuit 102 has such a structure, a desired circuit is selected from the circuit 102a[1] to the circuit 102a[n] and power supply to the selected circuit by using the wiring SWBL[1] to the wiring SWBL[n] can be stopped. Thus, only a needed circuit of the circuit 102a[1] to the circuit 102a[n] can be driven, so that power consumption needed for the regulator circuit 102 can be reduced.

In the structure of the regulator circuit 102 illustrated in FIG. 4(B), only the terminal TLb1, the terminal TLb2, the terminal TLb3, the terminal TLb4, the wiring ADJL[1], the wiring ADJL[n], the wiring SWBL[1], the wiring SWBL[n], the capacitor C3[1], the capacitor C3[n], the switch SWa[1], the switch SWa[n], the switch SWb[1], the switch SWb[n], the circuit 102a[1], and the circuit 102a[n] are illustrated, and other circuits, elements, wirings, and the like are omitted.

<<Circuit 103, Circuit 104>>

Figure 5:
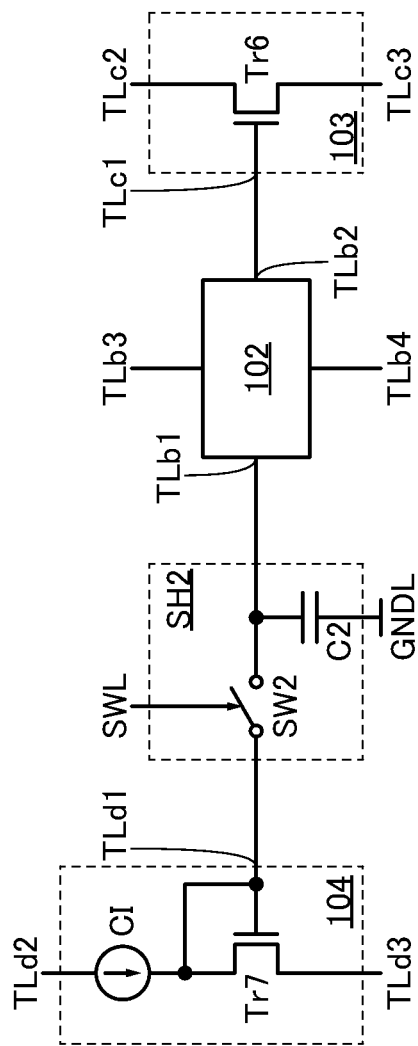
FIG. 5 A circuit diagram illustrating a structure example of a circuit included in a semiconductor device.

Next, circuit structures of the circuit 103 and the circuit 104 are described. FIG. 5 illustrates examples of the circuit structures of the circuit 103 and the circuit 104. Note that in order to describe the connection structure of the circuit 103 and the circuit 104, the regulator circuit 102 and the holding circuit SH2 are also illustrated in FIG. 5.

The circuit 103 includes the transistor Tr6 as illustrated in FIG. 2, and the circuit 104 includes a transistor Tr7 and a constant current source CI. Note that the transistor Tr7 is an n-channel transistor.

As illustrated in FIG. 2, the first terminal of the transistor Tr6 is electrically connected to the terminal TLc2, the second terminal of the transistor Tr6 is electrically connected to the terminal TLc3, and the gate of the transistor Tr6 is electrically connected to the terminal TLc1. A first terminal of the transistor Tr7 is electrically connected to an output terminal of the constant current source CI and a gate of the transistor Tr7, a second terminal of the transistor Tr7 is electrically connected to the terminal TLd3, and the gate of the transistor Tr7 is electrically connected to the terminal TLd1. An input terminal of the constant current source CI is electrically connected to the terminal TLd2.

According to the circuit structures illustrated in FIGS. 3(A) to 3(H) and FIGS. 4(A) and 4(B), the terminal TLb1 and the terminal TLb2 of the regulator circuit 102 are electrically connected to each other. In other words, when the switch SW2 of the holding circuit SH2 is in an on state, electrical continuity is established between the terminal TLc1 of the circuit 103 and the terminal TLd1 of the circuit 104, and thus a current mirror circuit is formed using the circuit 103 and the circuit 104. Note that the transistor Tr6 and the transistor Tr7 may have similar structures and sizes or different structures and sizes.

In addition, the transistor Tr1 to the transistor Tr7 can be transistors each including silicon in a channel formation region (hereinafter, referred to as Si transistors), for example. As silicon, hydrogenated amorphous silicon, microcrystalline silicon, polycrystalline silicon, single crystal silicon, or the like can be used, for example. In the case where the transistor Tr1 to the transistor Tr7 are Si transistors, the semiconductor device 100 preferably has a structure in which the transistor Tr1 to the transistor Tr7 are formed over a single crystal silicon substrate. Such a structure will be described in detail in Embodiment 3.

Operation Example

Next, an operation example of the semiconductor device of one embodiment of the present invention is described. Note that an operation of a semiconductor device 100A illustrated in FIG. 6 is described in this operation example.

Figure 6:
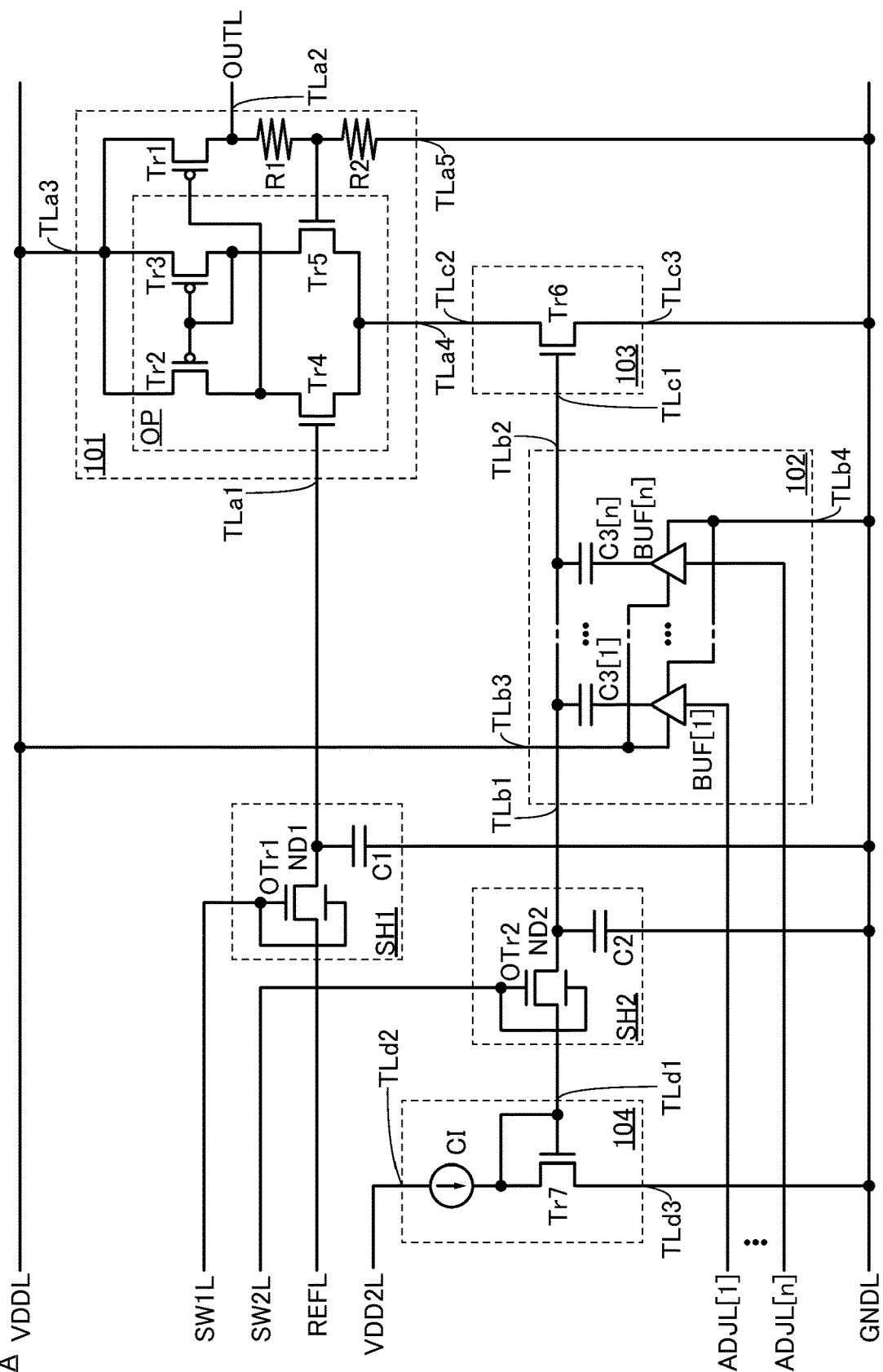
FIG. 6 A circuit diagram illustrating a structure example of a semiconductor device.

In the semiconductor device 100A illustrated in FIG. 6, the circuit 101 has the circuit structure illustrated in FIG. 2(B) and the circuit 103 and the circuit 104 have the circuit structures illustrated in FIG. 5.

The regulator circuit 102 of the semiconductor device 100A has a circuit structure in which the regulator circuit 102 illustrated in FIG. 3(B) and the regulator circuit 102 illustrated in FIG. 4(A) are combined. Specifically, a buffer circuit BUF[1] to a buffer circuit BUF[n] are used as the circuit 102a[1] to the circuit 102a[n] illustrated in FIG. 4(A).

In addition, a transistor OTr1 is used as the switch SW1 of the holding circuit SH1 of the semiconductor device 100A. Note that a first terminal of the transistor OTr1 corresponds to the first terminal of the switch SW1, a second terminal of the transistor OTr1 corresponds to the second terminal of the switch SW1, and a gate of the transistor OTr1 corresponds to the control terminal of the switch SW1. The transistor OTr1 is a transistor having a back gate, and the back gate of the transistor OTr1 is electrically connected to the gate of the transistor OTr1. With such a connection structure, the on-state current of the transistor OTr1 can be increased. Furthermore, when the holding circuit SH1 has a structure in which the back gate of the transistor OTr1 is electrically connected to not the gate of the transistor OTr1 but another wiring and a predetermined potential is supplied to the wiring, the threshold voltage of the transistor OTr1 can be changed. Note that the transistor OTr1 may be a transistor without a back gate. It is preferable that an OS transistor having a characteristic of extremely low off-state current be used as the transistor OTr1, because the transistor OTr1 preferably holds a potential to be written to the first terminal of the capacitor C1 for a long time.

In this operation example, an electrical connection point between the second terminal of the transistor OTr1 and the capacitor C1 is referred to as a node ND1.

In addition, a transistor OTr2 is used as the switch SW2 of the holding circuit SH2 of the semiconductor device 100A. Note that a first terminal of the transistor OTr2 corresponds to the first terminal of the switch SW2, a second terminal of the transistor OTr2 corresponds to the second terminal of the switch SW2, and a gate of the transistor OTr2 corresponds to the control terminal of the switch SW2. The transistor OTr2 is a transistor having a back gate like the transistor OTr1, and the back gate of the transistor OTr2 is electrically connected to the gate of the transistor OTr2. Since the structure of the holding circuit SH2 of the semiconductor device 100A is the same as the structure of the holding circuit SH1 of the semiconductor device 100A, the above description of the transistor OTr1 is referred to for the description of the transistor OTr2.

In this operation example, an electrical connection point between the second terminal of the transistor OTr2 and the capacitor C2 is referred to as a node ND2.

FIG. 1 illustrates the structure in which the holding circuit SH1 and the holding circuit SH2 are electrically connected to the wiring SWL, whereas FIG. 6 illustrates a structure in which the holding circuit SH1 is electrically connected to a wiring SW1L and the holding circuit SH2 is electrically connected to a wiring SW2L. That is, the holding circuit SH1 has a structure in which an on state and an off state of the transistor OTr1 are switched by a signal transmitted from the wiring SW1L and the holding circuit SH2 has a structure in which an on state and an off state of the transistor OTr2 are switched by a signal transmitted from the wiring SW2L. In other words, the transistor OTr1 and the transistor OTr2 can independently switch between an on state and an off state.

Note that unless otherwise specified, the transistor OTr1 and the transistor OTr2 operate in a linear region in the end in this operation example when they are in an on state. In other words, the gate voltage, the source voltage, and the drain voltage of each of the transistor OTr1 and the transistor OTr2 are assumed to be appropriately biased to be voltages in the range where the transistors operate in the linear region.

Unless otherwise specified, the transistor Tr1 to the transistor Tr7 operate in a saturation region. In other words, the gate voltage, the source voltage, and the drain voltage of each of the transistor Tr1 to the transistor Tr7 are assumed to be appropriately biased to be voltages in the range where the transistors operate in the saturation region.

Figure 7A:
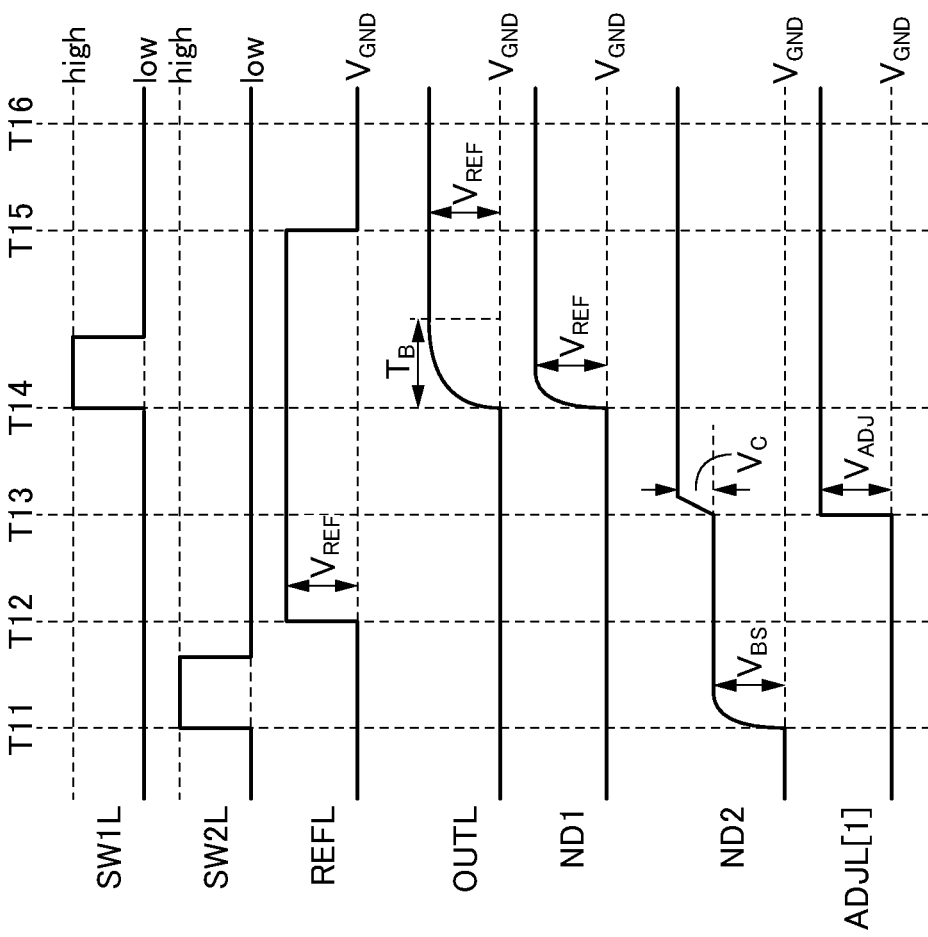
FIGS. 7A and 7B Timing charts each illustrating an operation example of a semiconductor device.
Figure 7B:
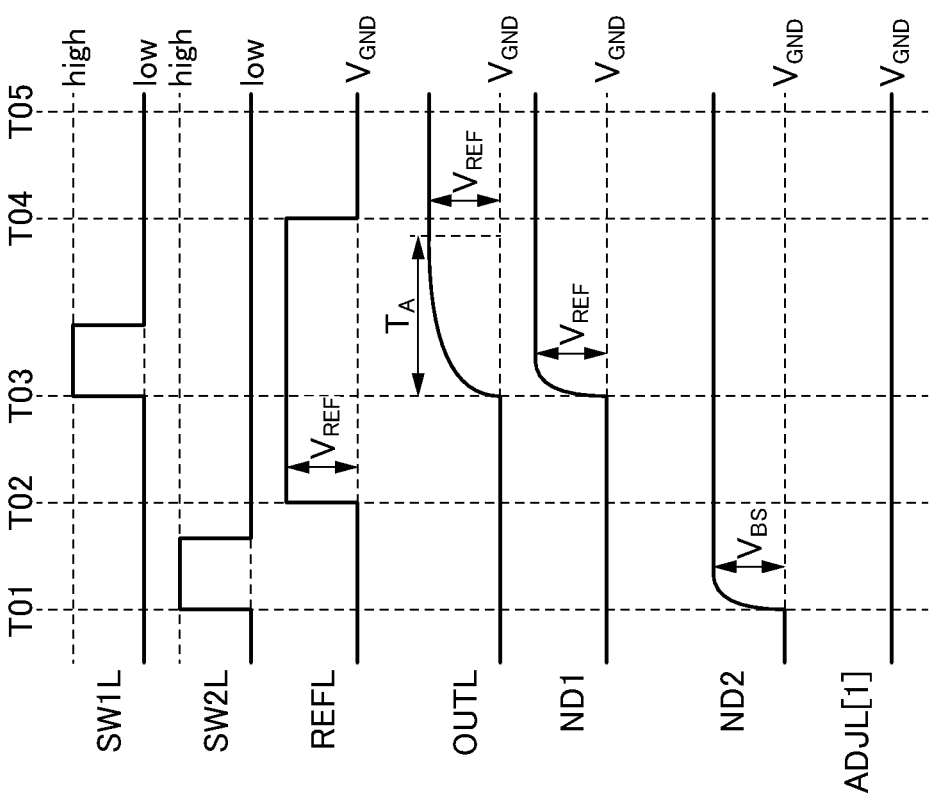

Next, a specific operation example of the semiconductor device 100A is described. FIGS. 7(A) and 7(B) are timing charts showing operation examples of the semiconductor device 100A. The timing chart of FIG. 7(A) shows changes in the potentials of the wiring SW1L, the wiring SW2L, the wiring REFL, the wiring OUTL, the node ND1, the node ND2, and the wiring ADJL[1] in and around a period from Time T01 to Time T05 in the case where the regulator circuit 102 does not operate. In addition, the timing chart of FIG. 7(B) shows changes in the potentials of the wiring SW1L, the wiring SW2L, the wiring REFL, the wiring OUTL, the node ND1, the node ND2, and the wiring ADJL[1] in and around a period from Time T11 to Time T16 in the case where the regulator circuit 102 operates. Note that in the timing charts of FIGS. 7(A) and 7(B), "high" refers to a high-level potential, "low" refers to a low-level potential, and $V_{GND}$ refers to a ground potential. Note that in this specification and the like, a "low-level potential" and a "high-level potential" do not represent any fixed potentials, and specific potentials may vary depending on wirings. Therefore, for example, the high-level potential supplied by the wiring SW1L may be different from the high-level potential supplied by the wiring SW2L. In addition, for example, the low-level potential supplied by the wiring SW1L may be different from the low-level potential supplied by the wiring SW2L.

<<Case where Regulator Circuit 102 is not Driven>>

First, an operation example of the semiconductor device 100A in the case where the regulator circuit 102 is not driven (FIG. 7(A)) is described.

Note that in the timing chart in FIG. 7(A), since the regulator circuit 102 is not driven, $V_{GND}$ is applied to the wiring ADJL[1] to the wiring ADJL[n] in and around the period from Time T01 to Time T05.

[Before Time T01]

Before Time T01, the low-level potentials are applied to the wiring SW1L and the wiring SW2L. Thus, the low-level potential is applied to the gate of the transistor OTr1 included in the holding circuit SH1, so that the transistor OTr1 is brought into an off state. In addition, the low-level potential is applied to the gate of the transistor OTr2 included in the holding circuit SH2, so that the transistor OTr2 is also brought into an off state.

$V_{GND}$ is applied to the wiring REFL. Note that not $V_{GND}$ but a reference potential or a given potential may be applied to the wiring REFL in this stage.

Before Time T01, each of the potentials of the node ND1 and the node ND2 is set to $V_{GND}$. Note that each of the potentials of the node ND1 and the node ND2 may be a potential other than $V_{GND}$.

Although the potential of the wiring OUTL is undetermined before Time T01, it is set to $V_{GND}$ in FIG. 7.

[From Time T01 to Time T02]

From Time T01 to Time T02, the high-level potential is applied to the wiring SW2L. Thus, the high-level potential is applied to the gate of the transistor OTr2 included in the holding circuit SH2, so that the transistor OTr2 is brought into an on state.

When the transistor OTr2 is brought into an on state, electrical continuity is established between the terminal TLc1 of the circuit 103 and the terminal TLd1 of the circuit 104, so that the current mirror circuit formed using the circuit 103 and the circuit 104 is operated. Thus, substantially the same source-drain current flows through the transistor Tr6 and the transistor Tr7. The amount of the source-drain current depends on the specifications of the constant current source CI. The potential of a wiring (the node ND2) between the terminal TLc1 of the circuit 103 and the terminal TLd1 of the circuit 104 is determined in accordance with the specifications of the constant current source CI, and the potential is written to the first terminal of the capacitor C2 of the holding circuit SH2. In this operation example, the potential is denoted by $V_{BS}$.

Since both the terminal TLc3 of the circuit 103 and the terminal TLd3 of the circuit 104 are electrically connected to the wiring GNDL, the source-drain current generated in the transistor Tr6 flows in the direction from the terminal TLc2 to the terminal TLc3 of the circuit 103. In other words, when the current mirror circuit formed using the circuit 103 and the circuit 104 is operated, current is discharged from the terminal TLa4 of the circuit 101.

After the potential of the node ND2 reaches $V_{BS}$, the low-level potential is applied to the wiring SW2L. Thus, since the low-level potential is applied to the gate of the transistor OTr2 included in the holding circuit SH2, the transistor OTr2 is brought into an off state.

At this time, the node ND2 is brought into an electrically floating state and $V_{BS}$ that is the potential of the node ND2 is held in the capacitor C2 included in the holding circuit SH2. Here, in the case where the constant current source CI is stopped, current stops flowing between the source and the drain of the transistor Tr7; however, the potential of the gate of the transistor Tr6, i.e., $V_{BS}$ that is the potential of the node ND2, is held and thus current flows between the source and the drain of the transistor Tr6. In other words, even when the constant current source CI is stopped, current can flow between the source and the drain of the transistor Tr6; thus, power consumption for driving the constant current source CI can be reduced.

[From Time T02 to Time T03]

$V_{REF}$ is supplied to the semiconductor device 100A from the wiring REFL as a reference potential from Time T02 to Time T03.

Note that since the transistor OTr1 is in an off state in this stage, a change in the potential of the node ND1 due to application of $V_{REF}$ from the wiring REFL does not occur.

[From Time T03 to Time T04]

From Time T03 to Time T04, the high-level potential is applied to the wiring SW1L. Thus, the high-level potential is applied to the gate of the transistor OTr1 included in the holding circuit SH1, so that the transistor OTr1 is brought into an on state.

When the transistor OTr1 is brought into an on state, the wiring REFL and the node ND1 are electrically connected to each other, so that the potential of the node ND1 becomes $V_{REF}$. At this time, the potential $V_{REF}$ of the node ND1 is written to the first terminal of the capacitor C1 of the holding circuit SH1.

After the potential of the node ND1 reaches $V_{REF}$, the low-level potential is applied to the wiring SW1L. Thus, the low-level potential is applied to the gate of the transistor OTr1 included in the holding circuit SH1, so that the transistor OTr1 is brought into an off state.

At this time, the node ND1 is brought into an electrically floating state and $V_{REF}$ that is the potential of the node ND1 is held in the capacitor C1 included in the holding circuit SH1.

Furthermore, $V_{REF}$ is input to the terminal TLa1 of the circuit 101. In this operation example, the case where the resistance value of the resistor R1 is as close to 0 as possible is considered. The circuit 101 outputs, from the terminal TLa2, a potential substantially equal to the potential input to the terminal TLa1; thus, the potential of the wiring OUTL is $V_{REF}$.

The response time (also referred to as a start-up time in some cases) that is a time taken from input of a potential to the terminal TLa1 to output of the potential from the terminal TLa2 is determined by the amount of current discharged from the terminal TLa4. As the amount of current is larger, the potential of a specific node in the circuit 101, for example, the potential of the first terminal of the transistor Tr4 or the potential of the first terminal of the transistor Try, can be changed more quickly, so that the start-up time of the circuit 101 can be shortened. Note that in the timing chart shown in FIG. 7(A), the start-up time is denoted by TA.

[From Time T04 to Time T05]

It is assumed that the potential of the wiring REFL is changed from $V_{REF}$ to $V_{GND}$ from Time T04 to Time T05.

Note that since the transistor OTr1 is in an off state in this stage, a change in the potential of the node ND1 due to a change in the potential of the wiring REFL from $V_{REF}$ to $V_{GND}$ does not occur. In other words, $V_{REF}$ is continued to be applied to the terminal TLa1 of the circuit 101 before Time T04. Thus, the potential of the wiring OUTL is not changed.

Although the potential of the wiring REFL is changed to $V_{GND}$ in FIG. 7(A), it may be set to a given potential. Furthermore, a voltage source for supplying a potential to the wiring REFL may be stopped. In this way, power consumption for driving a voltage source can be reduced.

<<Case where Regulator Circuit 102 is Driven>>

Next, an operation example of the semiconductor device 100A in the case where the regulator circuit 102 is driven (FIG. 7(B)) is described.

[Before Time T11]

The description of the operation before Time T01 in the timing chart in FIG. 7(A) is referred to for the operation of the semiconductor device 100A before Time T11.

[From Time T11 to Time T12]

The description of the operation from Time T01 to Time T02 in the timing chart in FIG. 7(A) is referred to for the operation of the semiconductor device 100A from Time T11 to Time T12.

[From Time T12 to Time T13]

The description of the operation from Time T02 to Time T03 in the timing chart in FIG. 7(A) is referred to for the operation of the semiconductor device 100A from Time T12 to Time T13.

[From Time T13 to Time T14]

As a given positive potential, $V_{ADJ}$ is applied to the wiring ADJL[1] from Time T13 to Time T14. Accordingly, $V_{ADJ}$ is input to an input terminal of the buffer circuit BUF[1] of the regulator circuit 102, and $V_{ADJ}$ is output from an output terminal of the buffer circuit BUF[1]. Thus, $V_{ADJ}$ is written to the second terminal of the capacitor C3[1] included in the regulator circuit 102.

Since the transistor OTr2 is brought into an off state after the potential $V_{BS}$ is held in the capacitor C2 from Time T11 to Time T12, the node ND2 is brought into an electrically floating state. For this reason, by writing $V_{ADJ}$ to the second terminal of the capacitor C3[1], the potential of the node ND2 (the wiring between the terminal TLc1 of the circuit 103 and the terminal TLd1 of the circuit 104) is changed because of capacitive coupling via the capacitor C3[1]. The amount of change in the potential of the node ND2 can be calculated on the basis of a capacitive coupling coefficient determined by an element, a wiring, and the like in the vicinity of the node ND2. Note that in this operation example, the amount of change in the potential of the node ND2 is denoted by $V_C$. Therefore, the potential of the node ND2 is $V_{BS}+V_C$ from Time T13 to Time T14.

[From Time T14 to Time T15]

The operation of the semiconductor device 100A from Time T14 to Time T15 is performed in a manner similar to the operation from Time T03 to Time T04 in the timing chart in FIG. 7(A).

That is, at Time T14, the transistor OTr1 is brought into an on state by application of the high-level potential to the wiring SW1L, and the potential $V_{REF}$ of the wiring REFL is written to the first terminal of the capacitor C1 of the holding circuit SH1 and input to the terminal TLa1 of the circuit 101. Furthermore, after the potential $V_{REF}$ is written to the first terminal of the capacitor C1 of the holding circuit SH1, the transistor OTr1 is brought into an off state and the potential $V_{REF}$ of the node ND1 is held in the capacitor C1.

In the case where the resistance value of the resistor R1 is as close to 0 as possible as in the case of FIG. 7(A), $V_{REF}$ is input to the terminal TLa1 of the circuit 101, whereby the circuit 101 outputs the potential $V_{REF}$ from the terminal TLa2. Thus, the potential of the wiring OUTL becomes $V_{REF}$.

[From Time T15 to Time T16]

The description of the operation from Time T04 to Time T05 in the timing chart in FIG. 7(A) is referred to for the operation of the semiconductor device 100A from Time T15 to Time T16.

Here, the potential of the gate of the transistor Tr6 of the circuit 103 from Time T14 to Time T15 is focused on. The potential of the gate of the transistor Tr6 of the circuit 103 is $V_{BS}+V_C$ that is the potential of the node ND2 and is higher than the potential $V_{BS}$ of the gate of the transistor Tr6 of the circuit 103 from Time T03 to Time T04 in the case where the regulator circuit 102 is not driven (FIG. 7(A)). In other words, the current flowing between the source and the drain of the transistor Tr6 of the circuit 103 in the case where the regulator circuit 102 is driven can be larger than that in the case where the regulator circuit 102 is not driven. Thus, the start-up time of the circuit 101 can be shorter than the start-up time TA of the case where the regulator circuit 102 is not driven. Note that in the timing chart in FIG. 7(B), the start-up time of the case where the regulator circuit 102 is driven is denoted by TB.

In this operation example, although an example is described in which a positive potential $V_{ADJ}$ is input to the input terminal of the buffer circuit BUF[1] of the regulator circuit 102 from Time T13 to Time T14, a given negative potential may be used instead of $V_{ADJ}$. When a negative potential is input to the input terminal of the buffer circuit BUF[1] of the regulator circuit 102, the potential of the node ND2 (the wiring between the terminal TLc1 of the circuit 103 and the terminal TLd1 of the circuit 104) can be lowered by capacitive coupling. Thus, the potential of the gate of the transistor Tr6 can be set lower than $V_{BS}$, enabling current consumption for driving the circuit to be suppressed. Note that in this case, the start-up time of the circuit 101 becomes longer than that in the case where the regulator circuit 102 is not driven. As a method other than the above method, a positive potential $V_{ADJ}$ may be input to the input terminal of the buffer circuit BUF[1] of the regulator circuit 102 from time before Time T11 to Time T13, and $V_G$ND may be input to the input terminal of the buffer circuit BUF[1] from Time T13 to Time T14 to lower the potential of the node ND2. In this case, it is not necessary to generate a negative potential; thus, a negative potential generation circuit can be omitted.

Furthermore, as another method, the high-level potential is input to input terminals of some of the buffer circuit BUF[1] to the buffer circuit BUF[n] and the low-level potential is input to the input terminals of the others from time before Time T11 to Time T13. After that, when the potential of an input terminal of one of the buffer circuit BUF[1] to the buffer circuit BUF[n] is changed from the high-level potential to the low-level potential or from the low-level potential to the high-level potential from Time T13 to Time T14, the potential of the node ND2 can be lowered or increased even without input of a negative potential.

Although not illustrated in the timing chart in FIG. 7(B), the regulator circuit 102 of the semiconductor device 100A can change the potential of the node ND2 (the wiring between the terminal TLc1 of the circuit 103 and the terminal TLd1 of the circuit 104) by using the buffer circuit BUF[2] to the buffer circuit BUF[n] and the capacitor C3[1] to the capacitor C3[n]. Thus, the potential of the node ND2 can be changed variously by not only a combination of the buffer circuit BUF[1] and the capacitor C3[1] but also combinations of the buffer circuit BUF[2] to the buffer circuit BUF[n] and the capacitor C3[2] to the capacitor C3[n].

Furthermore, when the regulator circuit 102 of the semiconductor device 100A is the regulator circuit 102 in FIG. 3(G), the potential of the node ND2 can be changed in accordance with output of the terminal TLa2 (the wiring OUTL) of the circuit 101. For example, the potential output from the terminal TLa2 of the circuit 101 is lower than the reference potential input to the inverting input terminal of the comparator CMP1 just after the circuit 101 starts to be driven, so that the potential of the node ND2 is increased by the operation of the regulator circuit 102. When the potential of the node ND2 becomes high, the potential input to the terminal TLc1 of the circuit 103 also becomes high; thus, the amount of the bias current generated in the circuit 103 can be increased. Thus, the drive capability of the circuit 101 can be increased.

When the potential output from the terminal TLa2 (the wiring OUTL) of the circuit 101 becomes higher than the reference potential input to the inverting input terminal of the comparator CMP1 by driving of the circuit 101, the potential of the wiring electrically connected to the terminal TLb1 and the terminal TLb2 becomes low by the operation of the regulator circuit 102. Thus, the amount of the bias current generated in the circuit 103 can be reduced, so that the drive capability of the circuit 101 can be reduced and the power consumption of the circuit 101 can be reduced.

As described above, the semiconductor device of one embodiment of the present invention can adjust the start-up time of the circuit 101 and the current consumption of the circuit. The start-up time and the current consumption can be optimized in accordance with the circuit, the device, or the like connected to the wiring OUTL of the semiconductor device.

Note that the operation of the semiconductor device of one embodiment of the present invention is not limited to the above operation example. In the operation of the semiconductor device, the operation timing in the above-described operation example can be changed depending on the situation. For example, although the potential $V_{ADJ}$ is applied to the wiring ADJL[1] at Time T13 in the operation example in FIG. 7(B), a given potential may be supplied to the wiring ADJL[2] to the wiring ADJL[n] and the potential of the node ND2 may be changed. For example, although the potential $V_{REF}$ is applied to the wiring REFL at Time T12 in the operation example in FIG. 7(B), the potential $V_{REF}$ may be applied before Time T11. For example, although the high-level potential is applied to the wiring SW2L at Time T11 and the high-level potential is applied to the wiring SW1L at Time T14 in the operation example in FIG. 7(B), the high-level potential may be supplied to the wiring SW1L and the wiring SW2L at the same time.

Note that this embodiment can be combined with other embodiments or an example in this specification as appropriate.

Embodiment 2

In this embodiment, another structure example of the semiconductor device 100 (the semiconductor device 100A) described in Embodiment 1 is described.

Figure 8:
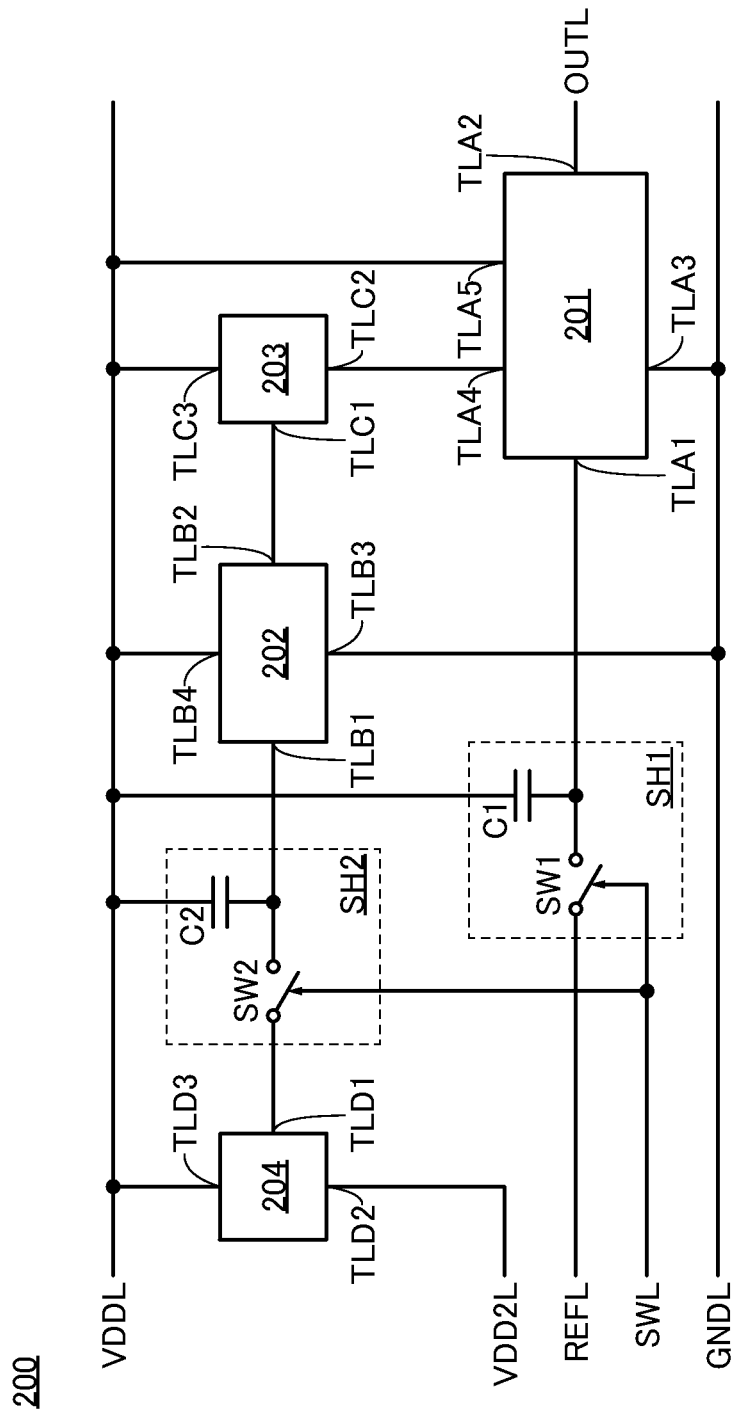
FIG. 8 A block diagram illustrating a structure example of a semiconductor device.

FIG. 8 is a block diagram illustrating a structure of a semiconductor device in the case where the polarities of the transistors included in the semiconductor device 100 in FIG. 1 are switched. A semiconductor device 200 includes a circuit 201, a regulator circuit 202, a circuit 203, a circuit 204, the holding circuit SH1, and the holding circuit SH2.

The circuit 201 corresponds to the circuit 101 described in Embodiment 1 and includes a terminal TLA1 to a terminal TLA5. The terminal TLA1 is electrically connected to the holding circuit SH1, the terminal TLA2 is electrically connected to the wiring OUTL, the terminal TLA3 is electrically connected to the wiring GNDL, and the terminal TLA5 is electrically connected to the wiring VDDL.

The circuit 203 corresponds to the circuit 103 described in Embodiment 1 and includes a terminal TLC1 to a terminal TLC3. The terminal TLC2 is electrically connected to the terminal TLA4, and the terminal TLC3 is electrically connected to the wiring VDDL.

The regulator circuit 202 corresponds to the regulator circuit 102 described in Embodiment 1 and includes a terminal TLB1 to a terminal TLB4. The terminal TLB1 is electrically connected to the holding circuit SH2, the terminal TLB2 is electrically connected to the terminal TLC1, the terminal TLB3 is electrically connected to the wiring GNDL, and the terminal TLB4 is electrically connected to the wiring VDDL.

The circuit 204 corresponds to the circuit 104 described in Embodiment 1 and includes a terminal TLD1 to a terminal TLD3. The terminal TLD1 is electrically connected to the holding circuit SH2, the terminal TLD2 is electrically connected to the wiring VDD2L, and the terminal TLD3 is electrically connected to the wiring VDDL.

The descriptions of the holding circuit SH1 and the holding circuit SH2 in Embodiment 1 are referred to for the holding circuit SH1 and the holding circuit SH2. In the case where a transistor is used as the switch SW1 of the holding circuit SH1 and/or the switch SW2 of the holding circuit SH2, the polarity of the transistor in the semiconductor device 200 may be either an n-channel type or a p-channel type. Although the semiconductor device 200 has a structure in which the polarities of the transistors included in the semiconductor device 100 are switched as described above, the holding circuit SH1 and circuit SH2 are not limited to this.

<<Circuit 201, Circuit 203>>

Figure 9:
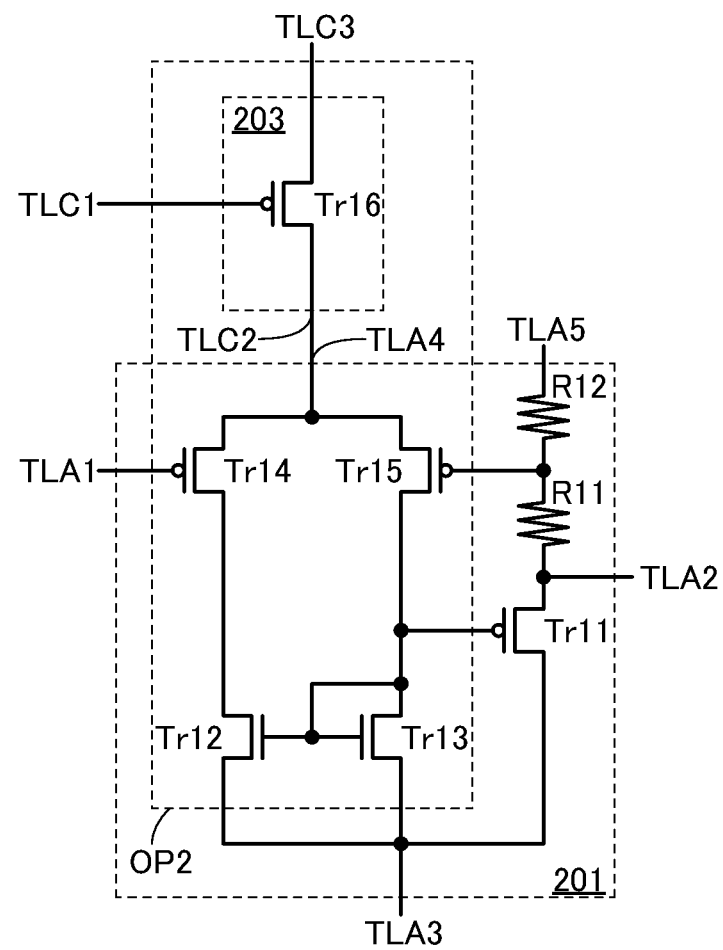
FIG. 9 A circuit diagram illustrating a structure example of a circuit included in a semiconductor device.

Next, the circuit structures of the circuit 201 and the circuit 203 are described. FIG. 9 illustrates examples of the circuit structures of the circuit 201 and the circuit 203.

The circuit 201 illustrated in FIG. 9 includes some of circuit elements included in an operational amplifier OP2, a transistor Tr11, a resistor R11, and a resistor R12. Note that the transistor Tr11 is a p-channel transistor. Furthermore, the operational amplifier OP2 includes a transistor Tr12 to a transistor Tr16. Note that the transistor Tr12 and the transistor Tr13 are n-channel transistors, and the transistor Tr14 to the transistor Tr16 are p-channel transistors. The circuit 203 illustrated in FIG. 9 includes the transistor Tr16. In other words, in the examples of the circuit structures of the circuit 201 and the circuit 203 illustrated in FIG. 9, the operational amplifier OP2 is formed of some of circuit elements of the circuit 201 and the circuit 203. In this case, the operational amplifier OP2 functions as an amplifier circuit that has a function of generating a bias current and a function of generating an output potential in accordance with a potential input to a differential pair (gates of the transistor Tr14 and the transistor Tr15) by the bias current.

A first terminal of the transistor Tr12 is electrically connected to the terminal TLA3, a second terminal of the transistor Tr12 is electrically connected to a first terminal of the transistor Tr14, and a gate of the transistor Tr12 is electrically connected to a gate of the transistor Tr13 and a second terminal of the transistor Tr13. A first terminal of the transistor Tr13 is electrically connected to the terminal TLA3, and the second terminal of the transistor Tr13 is electrically connected to a gate of the transistor Tr11 and a first terminal of the transistor Tr15.

A second terminal of the transistor Tr14 is electrically connected to the terminal TLA4, and the gate of the transistor Tr14 is electrically connected to the terminal TLA1. A second terminal of the transistor Tr15 is electrically connected to the terminal TLA4, and the gate of the transistor Tr15 is electrically connected to a first terminal of the resistor R11 and a first terminal of the resistor R12. A first terminal of the transistor Tr16 is electrically connected to the terminal TLC2, a second terminal of the transistor Tr16 is electrically connected to the terminal TLC3, and a gate of the transistor Tr16 is electrically connected to the terminal TLC1.

In other words, the gate of the transistor Tr14 corresponds to a non-inverting input terminal of the operational amplifier OP2, the gate of the transistor Tr15 corresponds to an inverting input terminal of the operational amplifier OP2, the first terminal of the transistor Tr12 and the first terminal of the transistor Tr13 correspond to a low power supply potential input terminal of the operational amplifier OP2, and the second terminal of the transistor Tr16 corresponds to a high power supply potential input terminal of the operational amplifier OP2.

A first terminal of the transistor Tr11 is electrically connected to the terminal TLA3. The terminal TLA2 is electrically connected to a second terminal of the transistor Tr11 and a second terminal of the resistor R11. The terminal TLA5 is electrically connected to a second terminal of the resistor R12.

The resistor R11 and the resistor R12 have a function of generating a feedback potential applied to the transistor Tr15. Thus, a circuit element such as a transistor or a diode can be used instead of the resistor R11 and/or the resistor R12.

The circuit 201 and the circuit 203 have the circuit structures illustrated in FIG. 9, whereby, by inputting a reference potential to the non-inverting input terminal of the operational amplifier OP2 from the wiring REFL, a voltage in accordance with the reference potential can be generated in the circuit 201 and output from the terminal TLA2.

Note that in the operational amplifier OP2 illustrated in FIG. 9, a current mirror circuit is formed using the terminal TLA3 supplying a low power supply potential, the transistor Tr12, and the transistor Tr13, and a differential circuit is formed using the transistor Tr14 and the transistor Tr15. Therefore, the transistor Tr12 and the transistor Tr13 preferably have similar structures and sizes and the transistor Tr14 and the transistor Tr15 preferably have similar structures and sizes.

Unless otherwise specified, the transistor Tr11 to the transistor Tr15 operate in a saturation region. In other words, the gate voltage, the source voltage, and the drain voltage of each of the transistor Tr11 to the transistor Tr15 are assumed to be appropriately biased to be voltages in the range where the transistors operate in the saturation region.

Note that the descriptions of the circuit 101 and the circuit 103 in Embodiment 1 are referred to for the specific operations of the circuit 201 and the circuit 203.

<<Regulator Circuit 202>>

The regulator circuit 102 described in Embodiment 1 with reference to FIG. 3 can be used as the regulator circuit 202. In this case, the terminal TLB1 to the terminal TLB4 correspond to the terminal TLb1 to the terminal TLb4, respectively.

<<Circuit 203, Circuit 204>>

Figure 10:
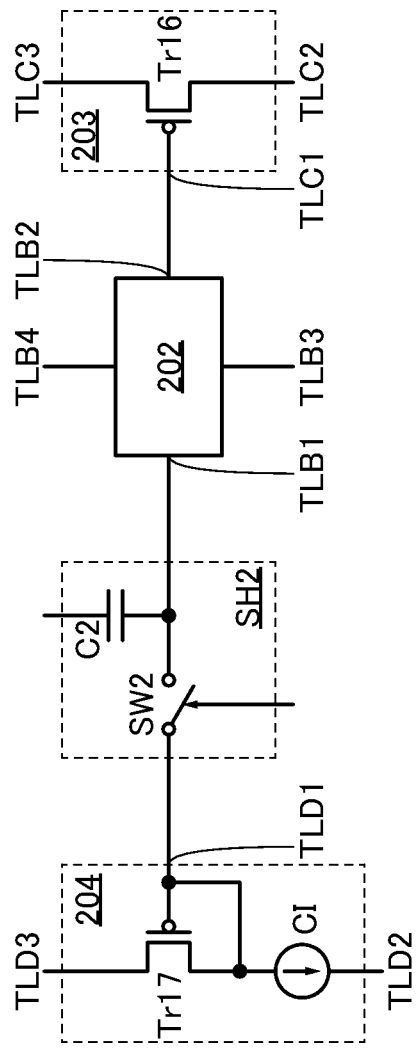
FIG. 10 A circuit diagram illustrating a structure example of a circuit included in a semiconductor device.

Next, circuit structures of the circuit 203 and the circuit 204 are described. FIG. 10 illustrates examples of the circuit structures of the circuit 203 and the circuit 204. Note that in order to describe the connection structure of the circuit 203 and the circuit 204, the regulator circuit 202 and the holding circuit SH2 are also illustrated in FIG. 10.

The circuit 203 includes the transistor Tr16, and the circuit 204 includes a transistor Tr17 and the constant current source CI. Note that the transistor Tr16 and the transistor Tr17 are p-channel transistors.

The first terminal of the transistor Tr16 is electrically connected to the terminal TLC2, the second terminal of the transistor Tr16 is electrically connected to the terminal TLC3, and the gate of the transistor Tr16 is electrically connected to the terminal TLC1. A first terminal of the transistor Tr17 is electrically connected to an input terminal of the constant current source CI and a gate of the transistor Tr17, a second terminal of the transistor Tr17 is electrically connected to the terminal TLD3, and the gate of the transistor Tr17 is electrically connected to the terminal TLD1. An output terminal of the constant current source CI is electrically connected to the terminal TLD2.

When the regulator circuit 102 illustrated in any of FIGS. 3(A) to 3(H) and FIGS. 4(A) and 4(B) is used as the regulator circuit 202, the terminal TLB1 and the terminal TLB2 of the regulator circuit 202 are electrically connected to each other. In other words, when the switch SW2 of the holding circuit SH2 is in an on state, electrical continuity is established between the terminal TLC1 of the circuit 203 and the terminal TLD1 of the circuit 204, and thus a current mirror circuit is formed using the circuit 203 and the circuit 204. Thus, the transistor Tr16 and the transistor Tr17 preferably have similar structures and sizes. Unless otherwise specified, the transistor Tr16 and the transistor Tr17 operate in a saturation region. In other words, the gate voltage, the source voltage, and the drain voltage of each of the transistor Tr16 and the transistor Tr17 are assumed to be appropriately biased to be voltages in the range where the transistors operate in the saturation region, like those of the transistor Tr11 to the transistor Tr15.

For example, Si transistors can be used as the transistor Tr11 to the transistor Tr17.

Figure 11:
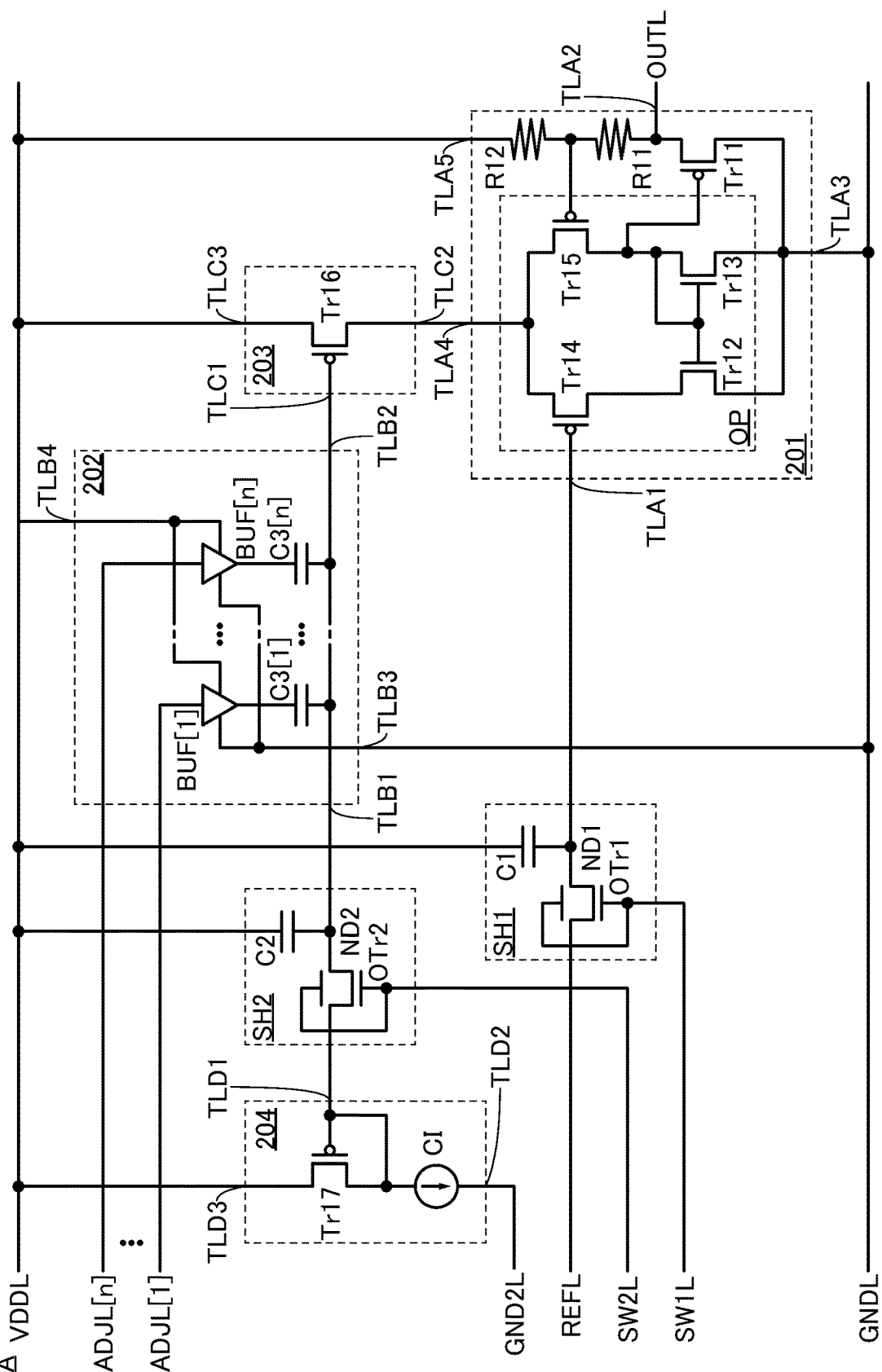
FIG. 11 A circuit diagram illustrating a structure example of a semiconductor device.

FIG. 11 illustrates a structure of a semiconductor device 200A in which the circuit 201 has the circuit structure illustrated in FIG. 9, the circuit 203 and the circuit 204 have the circuit structures illustrated in FIG. 10, and the regulator circuit 202 has a circuit structure similar to that of the regulator circuit 102 included in the semiconductor device 100A illustrated in FIG. 6.

A difference between the semiconductor device 100A and the semiconductor device 200A is that the terminal TLD2 of the circuit 204 included in the semiconductor device 200A is electrically connected to a wiring GND2L.

The wiring GND2L is a wiring for supplying a predetermined potential to the output terminal of the constant current source CI included in the circuit 204. The potential may be equal to the low power supply potential supplied by the wiring GNDL. Therefore, the terminal TLD2 may be electrically connected to not the wiring GND2L but the wiring GNDL.

The description of the operation example of the semiconductor device 100 (the semiconductor device 100A) in Embodiment 1 is referred to for the description of the operation of the semiconductor device 200A. In other words, the semiconductor device 200A can adjust the start-up time of the circuit 201 like the semiconductor device 100.

Note that this embodiment can be combined with other embodiments or an example in this specification as appropriate.

Embodiment 3

In this embodiment, cross-sectional structure examples of the semiconductor device 100 and the semiconductor device 100A described in Embodiment 1, the semiconductor device 200 described in Embodiment 2, and the like are described. Note that in this embodiment, the semiconductor device 100, the semiconductor device 100A, the semiconductor device 200 described in Embodiment 2, and the like are collectively referred to as a semiconductor device 300.

Structure Example of Semiconductor Device

Figure 12:
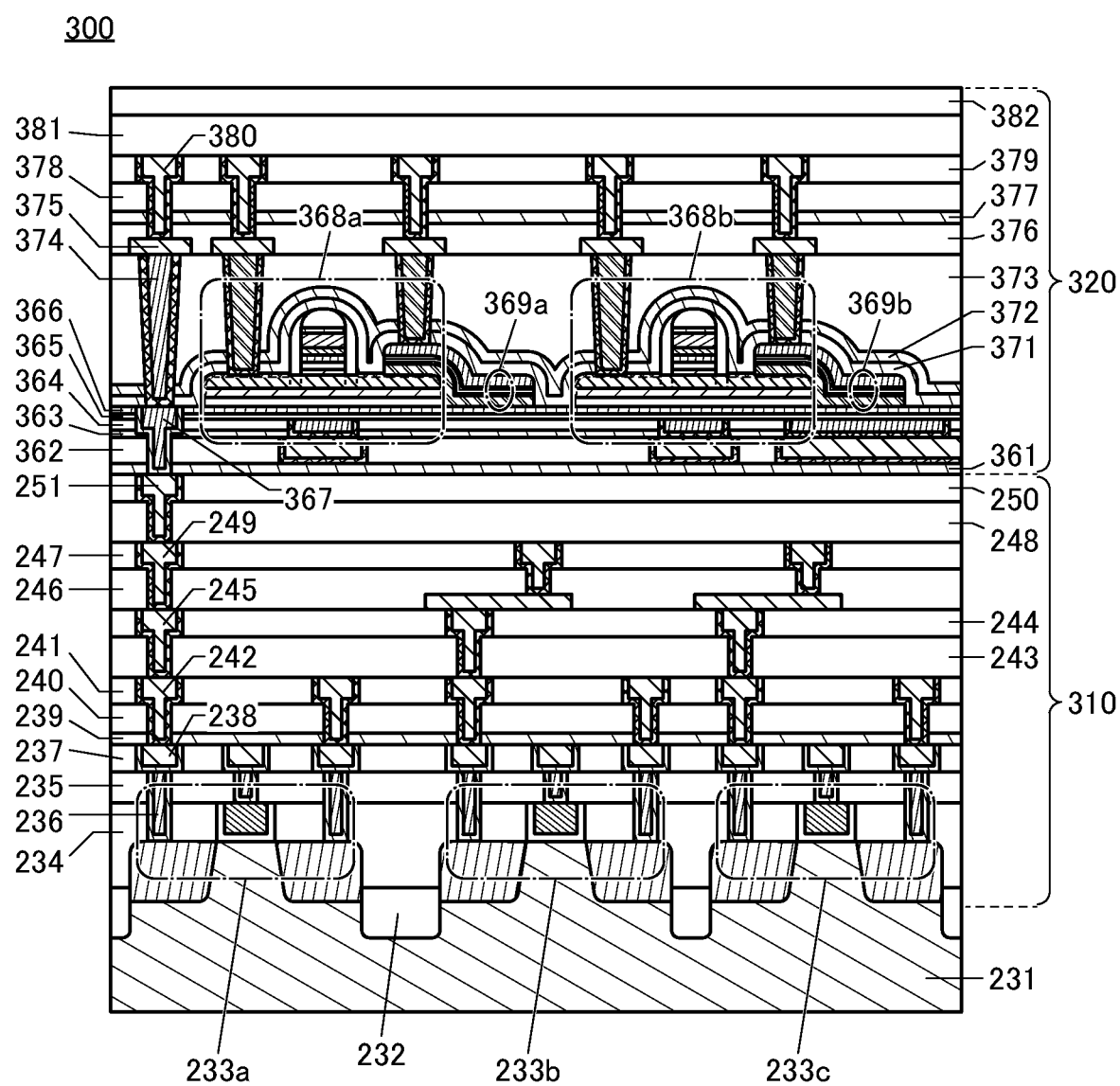
FIG. 12 A cross-sectional view illustrating a structure example of a semiconductor device.

FIG. 12 illustrates a cross section of part of the semiconductor device 300. In the semiconductor device 300 illustrated in FIG. 12, a layer 310 and a layer 320 are stacked over a substrate 231. FIG. 12 illustrates the case where a single crystal semiconductor substrate (e.g., a single crystal silicon substrate) is used as the substrate 231.

[Layer 310]

In FIG. 12, the layer 310 includes a transistor 233a, a transistor 233b, and a transistor 233c on the substrate 231. FIG. 12 illustrates cross sections of the transistor 233a, the transistor 233b, and the transistor 233c in the channel length direction.

Channels of the transistor 233a, the transistor 233b, and the transistor 233c are formed in part of the substrate 231. When an integrated circuit is required to operate at high speed, a single crystal semiconductor substrate is preferably used as the substrate 231.

The transistor 233a, the transistor 233b, and the transistor 233c are electrically isolated from each other by an element isolation layer 232. The element isolation layer can be formed by a LOCOS (Local Oxidation of Silicon) method, an STI (Shallow Trench Isolation) method, or the like.

The transistor 233a, the transistor 233b, and the transistor 233c correspond to one of the transistor Tr1 to the transistor Tr7 described in the above embodiment. Since the transistor Tr1 to the transistor Tr7 are desirably transistors with high on-state current and capable of high-speed operation, the transistor Tr1 to the transistor Tr7 are preferably formed over a single crystal silicon substrate.

An insulating layer 234 is provided over the substrate 231; an insulating layer 235 and an insulating layer 237 are provided over the transistor 233a, the transistor 233b, and the transistor 233c; and an electrode 238 is embedded in the insulating layer 237. The electrode 238 is electrically connected to one of a source and a drain of the transistor 233a through a contact plug 236.

An insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

An insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

An insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

An insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

[Layer 320]

The layer 320 is provided over the layer 310. The layer 320 includes a transistor 368a, a transistor 368b, a capacitor 369a, and a capacitor 369b. FIG. 12 illustrates cross sections of the transistor 368a and the transistor 368b in the channel length direction. The transistor 368a and the transistor 368b are each a transistor including a back gate.

The transistor 368a and the transistor 368b correspond to the transistor OTr1 and the transistor OTr2 described in the above embodiment. Therefore, an oxide semiconductor, which is one kind of metal oxide, is preferably used for semiconductor layers of the transistor 368a and the transistor 368b. That is, OS transistors are preferably used as the transistor 368a and the transistor 368b.

The transistor 368a and the transistor 368b are provided over an insulating layer 361 and an insulating layer 362. An insulating layer 363 and an insulating layer 364 are provided over the insulating layer 362. The back gates of the transistor 368a and the transistor 368b are embedded in the insulating layer 363 and the insulating layer 364. An insulating layer 365 and an insulating layer 366 are provided over the insulating layer 364. An electrode 367 is embedded in the insulating layer 361 to the insulating layer 366. The electrode 367 is electrically connected to the electrode 251.

An insulating layer 371, an insulating layer 372, and an insulating layer 373 are formed over the transistor 368a, the transistor 368b, the capacitor 369a, and the capacitor 369b, and an electrode 375 is formed over the insulating layer 373. The electrode 375 is electrically connected to the electrode 367 through a contact plug 374.

An insulating layer 376, an insulating layer 377, an insulating layer 378, and an insulating layer 379 are provided over the electrode 375. An electrode 380 is embedded in the insulating layer 376 to the insulating layer 379. The electrode 380 is electrically connected to the electrode 375.

An insulating layer 381 and an insulating layer 382 are provided over the electrode 380 and the insulating layer 379.

<Materials>

[Substrate]

Although there is no particular limitation on a material used for a substrate, it is required to have heat resistance high enough to withstand at least heat treatment performed later. For example, a single crystal semiconductor substrate or a polycrystalline semiconductor substrate using silicon, silicon carbide, or the like as a material or a compound semiconductor substrate using silicon germanium or the like as a material can be used as the substrate. Furthermore, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high electron mobility transistor (HEMT) may be used. That is, the substrate is not limited to a simple supporting substrate and may be a substrate where a device such as another transistor is formed.

Furthermore, a glass substrate of barium borosilicate glass, aluminoborosilicate glass, or the like, a ceramic substrate, a quartz substrate, a sapphire substrate, or the like can be used as the substrate. Note that a flexible substrate may be used as the substrate. In the case where a flexible substrate is used, a transistor, a capacitor, or the like may be directly fabricated over the flexible substrate, or a transistor, a capacitor, or the like may be fabricated over another fabrication substrate and then separated therefrom and transferred onto the flexible substrate. Note that to perform separation from the fabrication substrate and transfer to the flexible substrate, a separation layer is preferably provided between the fabrication substrate and the transistor, the capacitor, or the like.

For the flexible substrate, for example, a metal, an alloy, a resin, glass, or fiber thereof can be used. The flexible substrate used as the substrate preferably has a lower coefficient of linear expansion because deformation due to an environment is inhibited. For the flexible substrate used as the substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K is used. Examples of the resin include polyester, polyolefin, polyamide (e.g., nylon and aramid), polyimide, polycarbonate, and acrylic. In particular, aramid is suitable for the flexible substrate because of its low coefficient of linear expansion.

[Insulating Layer]

For the insulating layer, a single layer or a stack of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. A material in which a plurality of materials selected from an oxide material, a nitride material, an oxynitride material, and a nitride oxide material are mixed may be used.

Note that in this specification and the like, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$ in secondary ion mass spectrometry (SIMS). It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

It is preferred that at least a region of the insulating layer in contact with the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3 \times 10^{17}$ spins/cm$^3$, preferably lower than or equal to $5 \times 10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor of greater than or equal to 2.037 and less than or equal to 2.039 (referred to as a first signal), a signal observed at a g-factor of greater than or equal to 2.001 and less than or equal to 2.003 (referred to as a second signal), and a signal observed at a g-factor of greater than or equal to 1.964 and less than or equal to 1.966 (referred to as a third signal).

For example, as the insulating layer, it is suitable to use an insulating layer whose spin density of a signal due to nitrogen dioxide ($NO_2$) is higher than or equal to $1 \times 10^{17}$ spins/cm$^3$ and lower than $1 \times 10^{18}$ spins/cm$^3$.

Note that nitrogen oxide ($NO_x$) including nitrogen dioxide ($NO_2$) forms a state in the insulating layer. The state is positioned in the energy gap of the oxide semiconductor layer. Thus, when nitrogen oxide ($NO_x$) is diffused into the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer can reduce a shift in the threshold voltage of the transistor.

As an insulating layer that releases a small amount of nitrogen oxide ($NO_x$), for example, a silicon oxynitride layer can be used. The silicon oxynitride layer is a film that releases more ammonia than nitrogen oxide ($NO_x$) in thermal desorption spectroscopy (TDS); the typical released amount of ammonia is greater than or equal to $1 \times 10^{18}$ cm$^{-3}$ and less than or equal to $5 \times 10^{19}$ cm$^{-3}$. Note that the released amount of ammonia is the total amount in the range of the heat treatment temperature in TDS from 50° C. to 650° C. or from 50° C. to 550° C.

Since nitrogen oxide ($NO_x$) reacts with ammonia and oxygen in heat treatment, the use of an insulating layer that releases a large amount of ammonia reduces nitrogen oxide ($NO_x$).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0 \times 10^{18}$ atoms/cm$^3$ or more, $1.0 \times 10^{19}$ atoms/cm$^3$ or more, or $1.0 \times 10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}O_2$ or $^{18}O_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Electrode]

As a conductive material for forming the electrode, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. A semiconductor having high electrical conductivity, typified by polycrystalline silicon containing an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Furthermore, indium gallium zinc oxide containing nitrogen may be used.

A stack including a plurality of conductive layers formed of the above materials may be used. For example, a stacked-layer structure in which a material containing the above metal element and a conductive material containing oxygen are combined may be employed. A stacked-layer structure in which a material containing the above metal element and a conductive material containing nitrogen are combined may be employed. A stacked-layer structure in which a material containing the above metal element, a conductive material containing oxygen, and a conductive material containing nitrogen are combined may be employed. A stacked-layer structure in which a conductive material containing nitrogen and a conductive material containing oxygen are combined may be employed.

Note that in the case where an oxide semiconductor is used for the semiconductor layer and the gate electrode employs a stacked-layer structure in which a material containing the above metal element and a conductive material containing oxygen are combined, the conductive material containing oxygen is preferably provided on the semiconductor layer side. By providing the conductive material containing oxygen on the semiconductor layer side, oxygen released from the conductive material is easily supplied to the semiconductor layer.

For the electrode, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination. Note that the electrode may be referred to as a "contact plug".

In particular, for the electrode in contact with the gate insulator, a conductive material through which impurities are less likely to pass is preferably used. An example of the conductive material through which impurities are less likely to pass is tantalum nitride.

When an insulating material through which impurities are less likely to pass is used for the insulating layer and a conductive material through which impurities are less likely to pass is used for the electrode, diffusion of impurities to the transistor can be further inhibited. Thus, the reliability of the transistor can be further increased. That is, the reliability of the semiconductor device can be further increased.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Furthermore, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

Note that semiconductor layers may be stacked. In the case of stacking semiconductor layers, semiconductors having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A semiconductor device or the like with high reliability can be provided. A semiconductor device with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to have relatively high mobility compared with the OS transistor. On the other hand, the crystalline Si transistor has difficulty in obtaining an extremely low off-state current unlike the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen is used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

An oxide semiconductor, which is one kind of metal oxide, preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Composition of Metal Oxide]

A CAC (Cloud-Aligned Composite)-OS and a CAAC (c-axis aligned crystalline)-OS that can be used in a transistor disclosed in one embodiment of the present invention will be described below.

Note that in this specification and the like, CAC refers to an example of a function or a material composition, and CAAC (c-axis aligned crystal) refers to an example of a crystal structure.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, in some cases, the conductive regions and the insulating regions each have a size greater than or equal to 0.5 nm and less than or equal to 10 nm, preferably greater than or equal to 0.5 nm and less than or equal to 3 nm, and are dispersed in the material.

The CAC-OS or the CAC-metal oxide includes components having different bandgaps. For example, the CAC-OS or the CAC-metal oxide includes a component having a wide gap due to the insulating region and a component having a narrow gap due to the conductive region. In this structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

An oxide semiconductor, which is one kind of metal oxide, is classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, in the CAAC-OS, a reduction in electron mobility due to a grain boundary is less likely to occur because it is difficult to observe a clear grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (a metal oxide) can have various structures with different properties. The oxide semiconductor may include two or more of an amorphous oxide semiconductor, a polycrystalline oxide semiconductor, an a-like OS, an nc-OS, and a CAAC-OS.

[Transistor Including Metal Oxide]

Next, the case where the above metal oxide is used in a channel formation region of a transistor will be described.

Note that when the above metal oxide is used in a channel formation region of a transistor, a transistor having high field-effect mobility can be achieved. In addition, a transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1\times10^{11}/cm^3$, further preferably lower than $1\times10^{10}/cm^3$, and higher than or equal to $1\times10^{-9}/cm^3$.

A highly purified intrinsic or substantially highly purified intrinsic metal oxide film has a low density of defect states and accordingly may have a low density of trap states.

Charges trapped by the trap states in the metal oxide take a long time to disappear and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

When containing nitrogen, the metal oxide easily becomes n-type by generation of electrons serving as carriers and an increase in carrier density. As a result, a transistor using a metal oxide that contains nitrogen for its channel formation region is likely to have normally-on characteristics. Thus, nitrogen in the channel formation region in the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics. Accordingly, hydrogen in the metal oxide is preferably reduced as much as possible. Specifically, the hydrogen concentration in the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which the impurities are sufficiently reduced is used in a channel formation region of a transistor, stable electrical characteristics can be given.

<Deposition Method>

An insulating material for forming the insulating layer, a conductive material for forming the electrode, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, an MBE (Molecular Beam Epitaxy) method, a PLD (Pulsed Laser Deposition) method, a dipping method, a spray coating method, a droplet discharging method (e.g., an inkjet method), or a printing method (e.g., screen printing or offset printing).

By a plasma CVD method, a high-quality film can be obtained at a relatively low temperature. With the use of a deposition method that does not use plasma at the time of deposition, such as an MOCVD method, an ALD method, or a thermal CVD method, damage is not easily caused on a surface where the film is deposited. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, in the case of a deposition method not using plasma, such plasma damage is not caused; thus, the yield of semiconductor devices can be increased. Moreover, since plasma damage during deposition is not caused, a film with few defects can be obtained.

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be favorably used to cover a surface of an opening with a high aspect ratio, for example. Note that an ALD method has a relatively low deposition rate, and thus is preferably used in combination with another deposition method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be deposited depending on the flow rate ratio of the source gases. Moreover, with a CVD method or an ALD method, by changing the flow rate ratio of the source gases while depositing the film, a film whose composition is continuously changed can be deposited. In the case of depositing a film while changing the flow rate ratio of the source gases, as compared with the case of depositing a film with the use of a plurality of deposition chambers, the time taken for the deposition can be shortened because the time taken for transfer and pressure adjustment is omitted. Thus, semiconductor devices can be manufactured with improved productivity in some cases.

Note that in the case of depositing a film by an ALD method, a gas that does not contain chlorine is preferably used as a material gas.

Note that this embodiment can be combined with other embodiments or an example in this specification as appropriate.

Embodiment 4

In this embodiment, a structure example of a transistor that can be used in the semiconductor device and the like described in the above embodiment will be described.

Transistor Structure Example 1

Figure 13A:
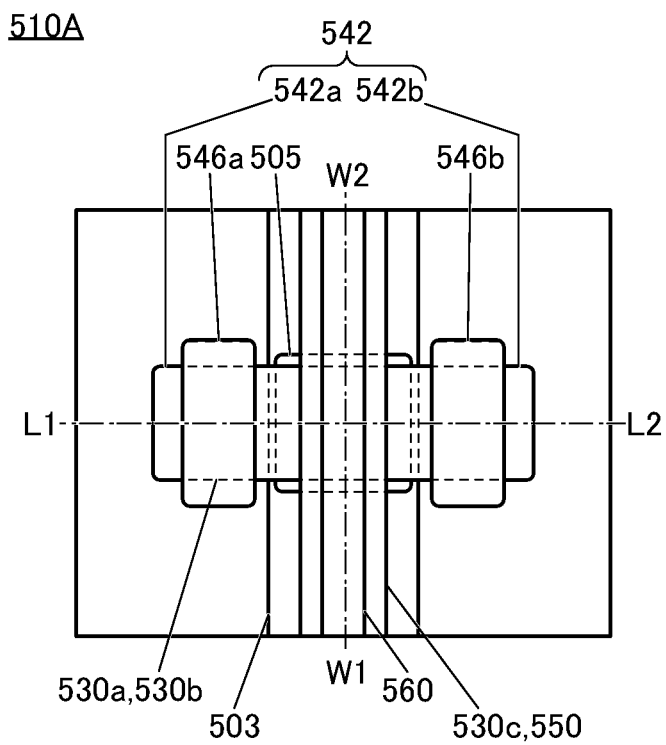
FIGS. 13A to 13C A top view and cross-sectional views illustrating a structure example of a transistor.
Figure 13C:
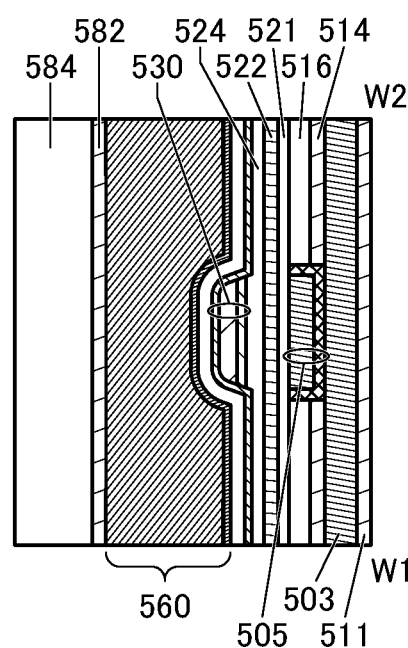
Figure 13B:
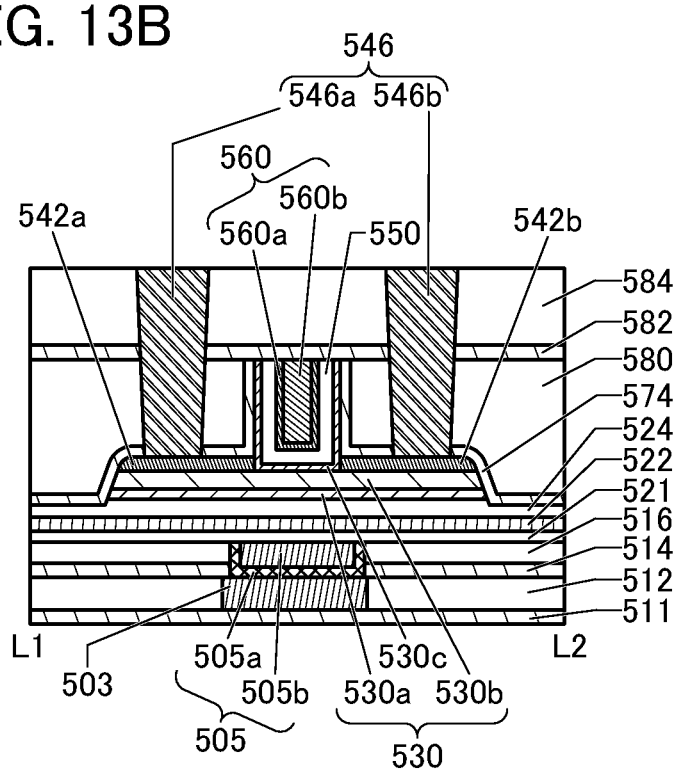

A structure example of a transistor 510A is described with reference to FIGS. 13(A), 13(B), and 13(C). FIG. 13(A) is a top view of the transistor 510A. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). For clarity of the drawing, some components are not illustrated in the top view of FIG. 13(A).

FIGS. 13(A), 13(B), and 13(C) illustrate the transistor 510A and an insulating layer 511, an insulating layer 512, an insulating layer 514, an insulating layer 516, an insulating layer 580, an insulating layer 582, and an insulating layer 584 that function as interlayer films. In addition, a conductive layer 546 (a conductive layer 546a and a conductive layer 546b) that is electrically connected to the transistor 510A and functions as a contact plug, and a conductive layer 503 functioning as a wiring are illustrated.

The transistor 510A includes a conductive layer 560 (a conductive layer 560a and a conductive layer 560b) functioning as a first gate electrode; a conductive layer 505 (a conductive layer 505a and a conductive layer 505b) functioning as a second gate electrode; an insulating layer 550 functioning as a first gate insulator; an insulating layer 521, an insulating layer 522, and an insulating layer 524 that function as a second gate insulator; an oxide 530 (an oxide 530a, an oxide 530b, and an oxide 530c) including a region where a channel is formed; a conductive layer 542a functioning as one of a source and a drain; a conductive layer 542b functioning as the other of the source and the drain; and an insulating layer 574. Note that the conductive layer 542a and the conductive layer 542b are collectively referred to as a conductive layer 542 in this specification and the like.

In the transistor 510A illustrated in FIG. 13, the oxide 530c, the insulating layer 550, and the conductive layer 560 are positioned in an opening provided in the insulating layer 580 with the insulating layer 574 positioned therebetween. Moreover, the oxide 530c, the insulating layer 550, and the conductive layer 560 are positioned between the conductive layer 542a and the conductive layer 542b.

The insulating layer 511 and the insulating layer 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulating layer 511 preferably functions as a barrier layer that inhibits entry of impurities such as water and hydrogen into the transistor 510A from the substrate side. Accordingly, for the insulating layer 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulating layer 511. This structure can inhibit diffusion of impurities such as hydrogen and water to the transistor 510A side from the substrate side of the insulating layer 511.

For example, the dielectric constant of the insulating layer 512 is preferably lower than that of the insulating layer 511. When a material with a low dielectric constant is used for the interlayer film, the parasitic capacitance generated between wirings can be reduced.

The conductive layer 503 is formed to be embedded in the insulating layer 512. Here, the level of the top surface of the conductive layer 503 and the level of the top surface of the insulating layer 512 can be substantially the same. Note that although a structure in which the conductive layer 503 is a single layer is illustrated, the present invention is not limited thereto. For example, the conductive layer 503 may have a stacked-layer structure of two or more layers. Note that for the conductive layer 503, a conductive material that has high conductivity and contains tungsten, copper, or aluminum as its main component is preferably used.

In the transistor 510A, the conductive layer 560 sometimes functions as a first gate (also referred to as a top gate) electrode. The conductive layer 505 functions as a second gate (also referred to as a bottom gate) electrode. In that case, the threshold voltage of the transistor 510A can be controlled by changing a potential applied to the conductive layer 505 not in synchronization with but independently of a potential applied to the conductive layer 560. In particular, the threshold voltage of the transistor 510A can be higher than 0 V and the off-state current can be reduced by applying a negative potential to the conductive layer 505. Thus, drain current at the time when a potential applied to the conductive layer 560 is 0 V can be lower in the case where a negative potential is applied to the conductive layer 505 than in the case where a negative potential is not applied to the conductive layer 505.

For example, when the conductive layer 505 and the conductive layer 560 overlap with each other, in the case where a potential is applied to the conductive layer 560 and the conductive layer 505, an electric field generated from the conductive layer 560 and an electric field generated from the conductive layer 505 are connected and can cover a channel formation region formed in the oxide 530.

That is, the channel formation region can be electrically surrounded by the electric field of the conductive layer 560 having a function of the first gate electrode and the electric field of the conductive layer 505 having a function of the second gate electrode. In this specification, a transistor structure in which a channel formation region is electrically surrounded by electric fields of a first gate electrode and a second gate electrode is referred to as a surrounded channel (S-channel) structure.

Like the insulating layer 511 and the insulating layer 512, the insulating layer 514 and the insulating layer 516 function as interlayer films. For example, the insulating layer 514 preferably functions as a barrier layer that inhibits entry of impurities such as water and hydrogen into the transistor 510A from the substrate side. This structure can inhibit diffusion of impurities such as hydrogen and water to the transistor 510A side from the substrate side of the insulating layer 514. Moreover, for example, the insulating layer 516 preferably has a lower dielectric constant than the insulating layer 514. When a material with a low dielectric constant is used for the interlayer film, the parasitic capacitance generated between wirings can be reduced.

In the conductive layer 505 functioning as the second gate electrode, the conductive layer 505a is formed in contact with an inner wall of an opening in the insulating layer 514 and the insulating layer 516, and the conductive layer 505b is formed further inside. Here, the top surfaces of the conductive layer 505a and the conductive layer 505b and the top surface of the insulating layer 516 can be substantially level with each other. Although the transistor 510A having a structure in which the conductive layer 505a and the conductive layer 505b are stacked is illustrated, the present invention is not limited thereto. For example, the conductive layer 505 may have a single-layer structure or a stacked-layer structure of three or more layers.

Here, for the conductive layer 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductive layer 505a has a function of inhibiting diffusion of oxygen, a reduction in conductivity of the conductive layer 505b due to oxidation can be inhibited.

In the case where the conductive layer 505 doubles as a wiring, for the conductive layer 505b, it is preferable to use a conductive material that has high conductivity and contains tungsten, copper, or aluminum as its main component. In that case, the conductive layer 503 is not necessarily provided. Note that the conductive layer 505b is illustrated as a single layer but may have a stacked-layer structure, for example, a stack of any of the above conductive materials and titanium or titanium nitride.

The insulating layer 521, the insulating layer 522, and the insulating layer 524 function as a second gate insulator.

The insulating layer 522 preferably has a barrier property. The insulating layer 522 having a barrier property functions as a layer that inhibits entry of impurities such as hydrogen into the transistor 510A from the surroundings of the transistor 510A.

For the insulating layer 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulator. When a high-k material is used for an insulator functioning as the gate insulator, drive voltage (e.g., gate-source voltage) required for transistor operation can be reduced while the physical thickness of the gate insulator is maintained.

For example, it is preferable that the insulating layer 521 be thermally stable. For example, silicon oxide and silicon oxynitride, which have thermal stability, are preferable. Furthermore, when an insulator that is a high-k material is combined with silicon oxide or silicon oxynitride, the insulating layer 521 having a stacked-layer structure that has thermal stability and a high dielectric constant can be obtained.

Note that the second gate insulator is shown to have a three-layer stacked structure in FIG. 13, but may have a single-layer structure or a stacked-layer structure of two or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the oxide semiconductor described in the above embodiment, which is one kind of metal oxide, can be used.

Note that the oxide 530c is preferably provided in the opening provided in the insulating layer 580 with the insulating layer 574 positioned therebetween. When the insulating layer 574 has a barrier property, diffusion of impurities from the insulating layer 580 into the oxide 530 can be inhibited.

One of the conductive layers 542 functions as a source electrode and the other functions as a drain electrode.

For the conductive layer 542a and the conductive layer 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 13, a stacked-layer structure of two or more layers may be employed. For example, a tantalum nitride film and a tungsten film may be stacked. Alternatively, a titanium film and an aluminum film may be stacked. Further alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductive layer 542. For the barrier layer, a material having a barrier property against oxygen or hydrogen is preferably used. This structure can inhibit oxidation of the conductive layer 542 at the time of depositing the insulating layer 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductive layer 542 can be expanded. For example, a material having a low oxidation resistance and high conductivity, such as tungsten or aluminum, can be used for the conductive layer 542. Moreover, for example, a conductor that can be easily deposited or processed can be used.

The insulating layer 550 functions as a first gate insulator. The insulating layer 550 is preferably provided in the opening provided in the insulating layer 580 with the oxide 530c and the insulating layer 574 positioned therebetween.

As miniaturization and high integration of transistors progress, a problem such as leakage current may arise because of a thinner gate insulator. In that case, the insulating layer 550 may have a stacked-layer structure like the second gate insulator. When the insulator functioning as the gate insulator has a stacked-layer structure of a high-k material and a thermally stable material, a gate potential during operation of the transistor can be reduced while the physical thickness of the gate insulator is maintained. Furthermore, the stacked-layer structure can be thermally stable and have a high dielectric constant.

The conductive layer 560 functioning as a first gate electrode includes the conductive layer 560a and the conductive layer 560b over the conductive layer 560a. Like the conductive layer 505a, for the conductive layer 560a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

As a conductive material having a function of inhibiting oxygen diffusion, for example, tantalum, tantalum nitride, ruthenium, or ruthenium oxide is preferably used. For the conductive layer 560a, the oxide semiconductor that can be used as the oxide 530 can be used. In that case, when the conductive layer 560b is deposited by a sputtering method, the electric resistance of the oxide semiconductor is lowered so that the conductive layer 560a can become a conductor. This can be referred to as an OC (Oxide Conductor) electrode.

For the conductive layer 560b, it is preferable to use a conductive material containing tungsten, copper, or aluminum as its main component. The conductive layer 560 functions as a wiring, and thus, a conductor having high conductivity is preferably used. For example, a conductive material containing tungsten, copper, or aluminum as its main component can be used. The conductive layer 560b may have a stacked-layer structure, for example, a stack of any of the above conductive materials and titanium or titanium nitride.

The insulating layer 574 is positioned between the insulating layer 580 and the transistor 510A. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like.

The insulating layer 574 can inhibit diffusion of impurities such as water and hydrogen contained in the insulating layer 580 into the oxide 530b through the oxide 530c and the insulating layer 550. In addition, oxidation of the conductive layer 560 due to excess oxygen contained in the insulating layer 580 can be inhibited.

The insulating layer 580, the insulating layer 582, and the insulating layer 584 function as interlayer films.

Like the insulating layer 514, the insulating layer 582 preferably functions as a barrier insulating film that inhibits entry of impurities such as water and hydrogen into the transistor 510A from the outside.

Like the insulating layer 516, the insulating layer 580 and the insulating layer 584 preferably have a lower dielectric constant than the insulating layer 582. When a material with a low dielectric constant is used for the interlayer films, the parasitic capacitance generated between wirings can be reduced.

The transistor 510A may be electrically connected to another component through a plug or a wiring such as the conductive layer 546 embedded in the insulating layer 580, the insulating layer 582, and the insulating layer 584.

As a material for the conductive layer 546, a conductive material such as a metal material, an alloy material, a metal nitride material, or a metal oxide material can be used as a single layer or stacked layers, as in the conductive layer 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductive layer 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device including an OS transistor that has a low off-state current can be provided. Alternatively, a semiconductor device that has small variations in electrical characteristics, stable electrical characteristics, and improved reliability can be provided.

Transistor Structure Example 2

Figure 14A:
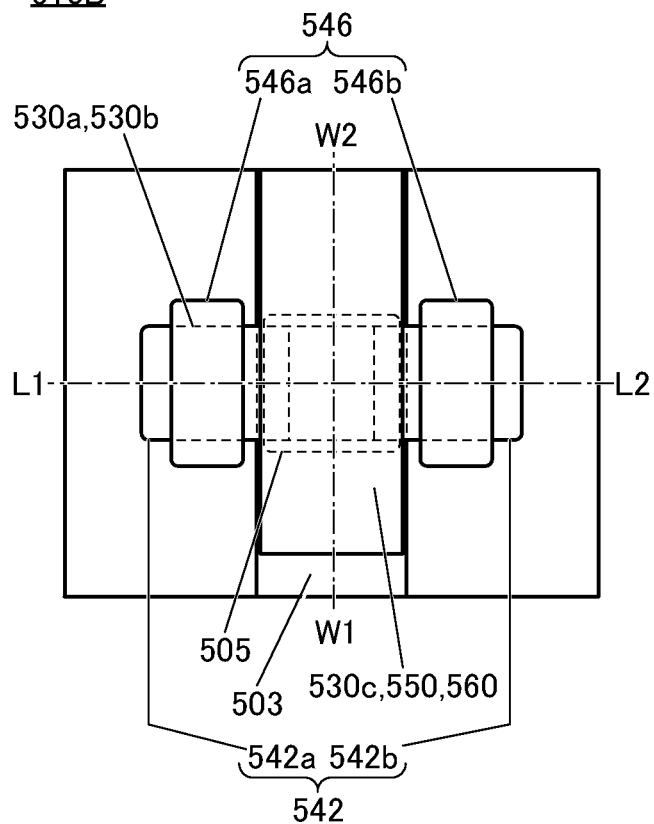
FIGS. 14A to 14C A top view and cross-sectional views illustrating a structure example of a transistor.
Figure 14C:
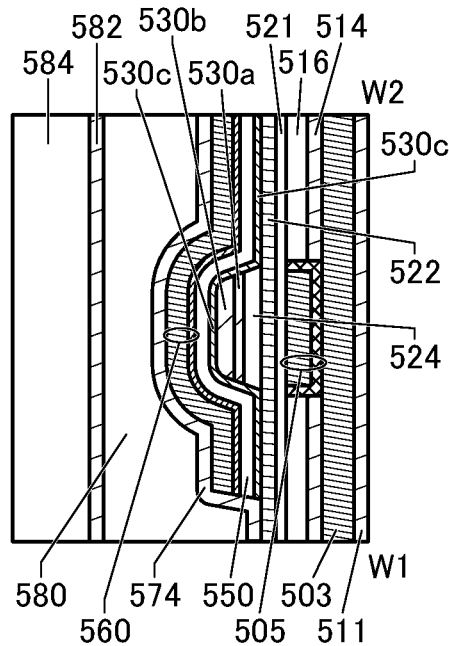
Figure 14B:
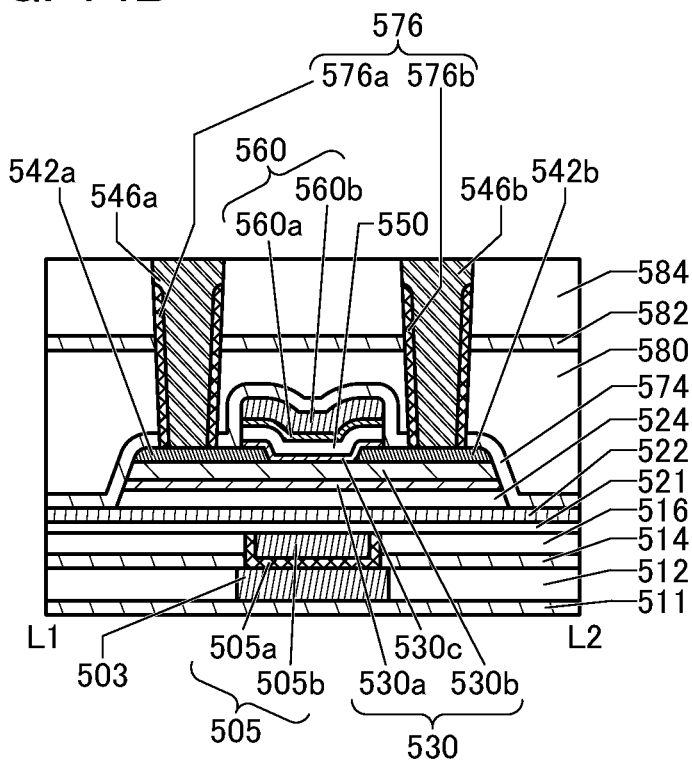

A structure example of a transistor 510B is described with reference to FIGS. 14(A), 14(B), and 14(C). FIG. 14(A) is a top view of the transistor 510B. FIG. 14(B) is a cross-sectional view of a portion indicated by a dashed-dotted line L1-L2 in FIG. 14(A). FIG. 14(C) is a cross-sectional view of a portion indicated by a dashed-dotted line W1-W2 in FIG. 14(A). For clarity of the drawing, some components are not illustrated in the top view of FIG. 14(A).

The transistor 510B is a variation example of the transistor 510A. Therefore, differences from the transistor 510A will be mainly described to avoid repeated description.

The transistor 510B includes a region where the conductive layer 542 (the conductive layer 542a and the conductive layer 542b), the oxide 530c, the insulating layer 550, and the conductive layer 560 overlap with each other. With this structure, a transistor having a high on-state current can be provided. Moreover, a transistor having high controllability can be provided.

The conductive layer 560 functioning as a first gate electrode includes the conductive layer 560a and the conductive layer 560b over the conductive layer 560a. Like the conductive layer 505a, for the conductive layer 560a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

The insulating layer 574 is preferably provided to cover the top surface and the side surface of the conductive layer 560, the side surface of the insulating layer 550, and the side surface of the oxide 530c. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like.

The insulating layer 574 can inhibit oxidation of the conductive layer 560. Moreover, the insulating layer 574 can inhibit diffusion of impurities such as water and hydrogen contained in the insulating layer 580 into the transistor 510B.

An insulating layer 576 (an insulating layer 576a and an insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

Furthermore, with the insulating layer 576 having a barrier property, the range of choices for the material of the conductor used as the plug or the wiring can be expanded. The use of a metal material having an oxygen absorbing property and high conductivity for the conductive layer 546, for example, can provide a semiconductor device with low power consumption. Specifically, a material having low oxidation resistance and high conductivity, such as tungsten or aluminum, can be used. Moreover, for example, a conductor that can be easily deposited or processed can be used.

Transistor Structure Example 3

Figure 15A:
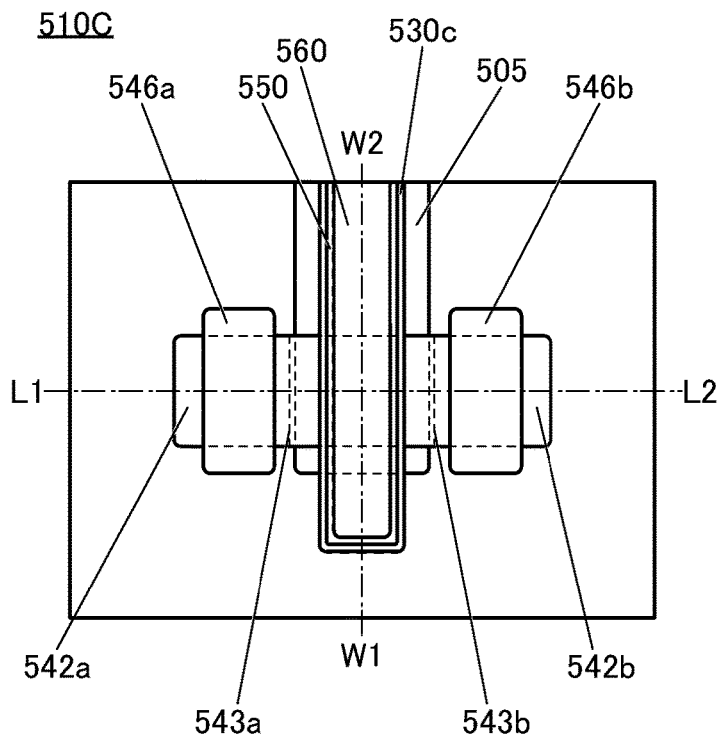
FIGS. 15A to 15C A top view and cross-sectional views illustrating a structure example of a transistor.
Figure 15C:
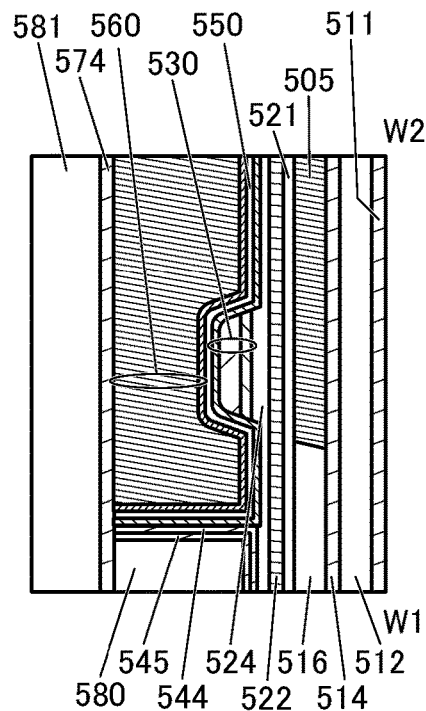
Figure 15B:
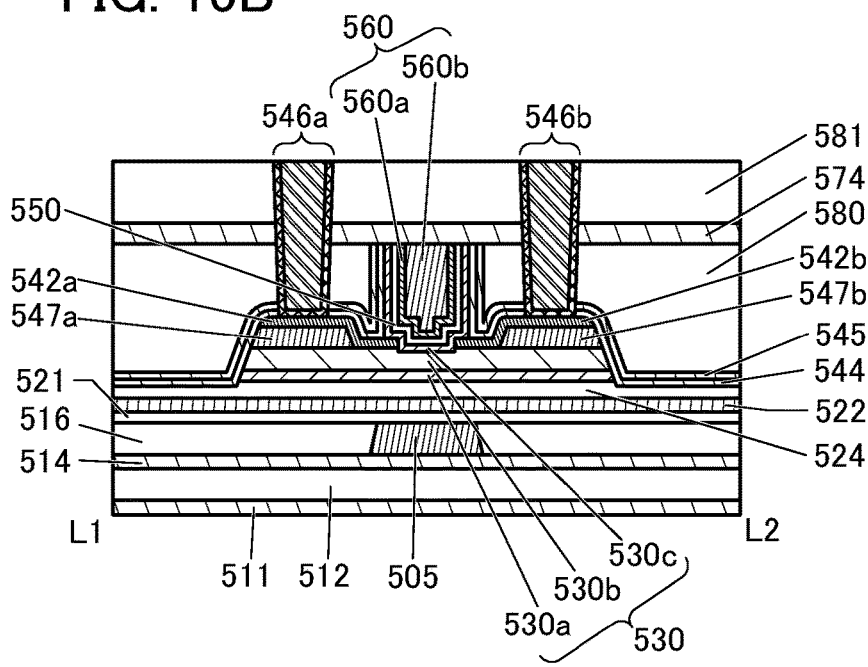

A structure example of a transistor 510C is described with reference to FIGS. 15(A), 15(B), and 15(C). FIG. 15(A) is a top view of the transistor 510C. FIG. 15(B) is a cross-sectional view of a portion indicated by a dashed-dotted line L1-L2 in FIG. 15(A). FIG. 15(C) is a cross-sectional view of a portion indicated by a dashed-dotted line W1-W2 in FIG. 15(A). For clarity of the drawing, some components are not illustrated in the top view of FIG. 15(A).

The transistor 510C is a variation example of the transistor 510A. Therefore, differences from the transistor 510A will be mainly described to avoid repeated description.

The transistor 510C illustrated in FIG. 15 includes a conductive layer 547a between the conductive layer 542a and the oxide 530b, and a conductive layer 547b between the conductive layer 542b and the oxide 530b. Here, the conductive layer 542a (the conductive layer 542b) extends beyond the top surface and the side surface on the conductive layer 560 side of the conductive layer 547a (the conductive layer 547b), and includes a region in contact with the top surface of the oxide 530b. For the conductive layer 547a (the conductive layer 547b), a conductor that can be used for the conductive layer 542 is used. It is preferred that the thickness of the conductive layer 547a (the conductive layer 547b) be at least greater than that of the conductive layer 542.

In the transistor 510C illustrated in FIG. 15 having such a structure, the conductive layer 542 can be closer to the conductive layer 560 than that in the transistor 510A is. Furthermore, the end portion of the conductive layer 542a and the end portion of the conductive layer 542b can overlap with the conductive layer 560. Accordingly, an effective channel length of the transistor 510C can be shortened, and the high on-state current and the frequency characteristics can be improved.

The conductive layer 547a (the conductive layer 547b) is preferably provided to overlap with the conductive layer 542a (the conductive layer 542b). With such a structure, the conductive layer 547a (the conductive layer 547b) functioning as a stopper can prevent over-etching of the oxide 530b by etching for forming the opening where the conductive layer 546a (the conductive layer 546b) is to be embedded.

In the transistor 510C illustrated in FIG. 15, the insulating layer 545 may be positioned on and in contact with the insulating layer 544. The insulating layer 544 preferably functions as a barrier insulating film that inhibits entry of impurities such as water and hydrogen and excess oxygen into the transistor 510C from the insulating layer 580 side. For the insulating layer 545, an insulator that can be used for the insulating layer 544 can be used. In addition, for the insulating layer 544, a nitride insulator such as aluminum nitride, aluminum titanium nitride, titanium nitride, silicon nitride, or silicon nitride oxide may be used, for example.

Unlike in the transistor 510A illustrated in FIG. 13, in the transistor 510C illustrated in FIG. 15, the conductive layer 505 may be provided to have a single-layer structure. In this case, an insulating film to be the insulating layer 516 is deposited over the patterned conductive layer 505, and an upper portion of the insulating film is removed by a CMP method or the like until the top surface of the conductive layer 505 is exposed. Preferably, the planarity of the top surface of the conductive layer 505 is made favorable. For example, the average surface roughness (Ra) of the top surface of the conductive layer 505 is less than or equal to 1 nm, preferably less than or equal to 0.5 nm, further preferably less than or equal to 0.3 nm. This allows the improvement in planarity of the insulating layer formed over the conductive layer 505 and the increase in crystallinity of the oxide 530b and the oxide 530c.

Transistor Structure Example 4

A structure example of a transistor 510D is described with reference to FIGS. 16(A), 16(B), and 16(C). FIG. 16(A) is a top view of the transistor 510D. FIG. 16(B) is a cross-sectional view of a portion indicated by a dashed-dotted line L1-L2 in FIG. 16(A). FIG. 16(C) is a cross-sectional view of a portion indicated by a dashed-dotted line W1-W2 in FIG. 16(A). For clarity of the drawing, some components are not illustrated in the top view of FIG. 16(A).

The transistor 510D is a variation example of the transistor 510A. Therefore, differences from the transistor 510A will be mainly described to avoid repeated description.

In FIGS. 16(A) to 16(C), the conductive layer 503 is not provided and the conductive layer 505 functioning as the second gate electrode also functions as a wiring. The insulating layer 550 is provided over the oxide 530c, and a metal oxide 552 is provided over the insulating layer 550. The conductive layer 560 is provided over the metal oxide 552, and an insulating layer 570 is provided over the conductive layer 560. An insulating layer 571 is provided over the insulating layer 570.

Thus, the metal oxide 552 preferably has a function of inhibiting diffusion of oxygen. When the metal oxide 552 that inhibits diffusion of oxygen is provided between the insulating layer 550 and the conductive layer 560, diffusion of the oxygen to the conductive layer 560 is inhibited. That is, a reduction in the amount of oxygen supplied to the oxide 530 can be inhibited. Moreover, oxidization of the conductive layer 560 due to oxygen can be inhibited.

Note that the metal oxide 552 may function as part of the first gate. For the metal oxide 552, an oxide semiconductor that can be used as the oxide 530 can be used, for example. In that case, when the conductive layer 560 is deposited by a sputtering method, the electric resistance of the metal oxide 552 is lowered so that the metal oxide 552 can become a conductive layer (the above-described OC electrode).

Note that the metal oxide 552 has a function of part of the gate insulator in some cases. Thus, when silicon oxide, silicon oxynitride, or the like is used for the insulating layer 550, a metal oxide that is a high-k material with a high dielectric constant is preferably used for the metal oxide 552. With such a stacked-layer structure, the stacked-layer structure can be thermally stable and have a high dielectric constant. Thus, a gate potential that is applied during operation of the transistor can be reduced while the physical thickness of the gate insulator is maintained. In addition, the equivalent oxide thickness (EOT) of an insulating layer functioning as the gate insulator can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of a gate insulator may be stacked.

With the metal oxide 552 functioning as a gate electrode, the on-state current of the transistor 510D can be increased without a reduction in the influence of the electric field generated from the conductive layer 560. With the metal oxide 552 functioning as a gate insulator, the distance between the conductive layer 560 and the oxide 530 is kept by the physical thicknesses of the insulating layer 550 and the metal oxide 552, so that leakage current between the conductive layer 560 and the oxide 530 can be reduced. Thus, with the stacked-layer structure of the insulating layer 550 and the metal oxide 552, the physical distance between the conductive layer 560 and the oxide 530 and the intensity of an electric field applied from the conductive layer 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than hafnium oxide. Therefore, hafnium aluminate is preferable because it is less likely to be crystallized by heat treatment in a later step. Note that the metal oxide 552 is not an essential structure. Design is appropriately set in consideration of required transistor characteristics.

For the insulating layer 570, an insulating material having a function of inhibiting passage of oxygen and impurities such as water and hydrogen is preferably used. For example, aluminum oxide or hafnium oxide is preferably used. Thus, oxidization of the conductive layer 560 due to oxygen from above the insulating layer 570 can be inhibited. Moreover, entry of impurities such as water and hydrogen from above the insulating layer 570 into the oxide 530 through the conductive layer 560 and the insulating layer 550 can be inhibited.

The insulating layer 571 functions as a hard mask. By providing the insulating layer 571, the conductive layer 560 can be processed to have the side surface that is substantially vertical; specifically, an angle formed by the side surface of the conductive layer 560 and a surface of the substrate can be greater than or equal to 75° and less than or equal to 100°, preferably greater than or equal to 80° and less than or equal to 95°.

An insulating material having a function of inhibiting passage of oxygen and impurities such as water and hydrogen may be used for the insulating layer 571 so that the insulating layer 571 also functions as a barrier layer. In that case, the insulating layer 570 does not have to be provided.

Parts of the insulating layer 570, the conductive layer 560, the metal oxide 552, the insulating layer 550, and the oxide 530c are selectively removed using the insulating layer 571 as a hard mask, so that the side surfaces of them are substantially aligned with each other and part of the surface of the oxide 530b can be exposed.

In the transistor 510D, part of the exposed surface of the oxide 530b includes a region 531a and a region 531b. One of the region 531a and the region 531b functions as a source region, and the other functions as a drain region.

The region 531a and the region 531b can be formed by, for example, introducing an impurity element such as phosphorus or boron to the exposed surface of the oxide 530b by an ion implantation method, an ion doping method, a plasma immersion ion implantation method, plasma treatment, or the like. In this embodiment and the like, an "impurity element" refers to an element other than main component elements.

The region 531a and the region 531b can also be formed in the following manner: a metal film is deposited after part of the surface of the oxide 530b is exposed and then the element contained in the metal film is diffused into the oxide 530b by heat treatment.

The regions of the oxide 530b into which the impurity element is introduced have decreased electric resistivity. Accordingly, the region 531a and the region 531b are each referred to as an "impurity region" or a "low-resistance region" in some cases.

With the use of the insulating layer 571 and/or the conductive layer 560 as a mask, the region 531a and the region 531b can be formed in a self-aligned manner. In that case, the conductive layer 560 does not overlap with the region 531a and/or the region 531b; thus, parasitic capacitance can be reduced. Furthermore, an offset region is not formed between the channel formation region and the source or drain region (the region 531a or the region 531b). The formation of the region 531a and the region 531b in a self-aligned manner achieves an increase in the on-state current, a reduction in the threshold voltage, and an improvement in the operation frequency, for example.

In order to further reduce the off-state current, the offset region may be provided between the channel formation region and the source or drain region. The offset region is a region which has high electric resistivity and into which the impurity element is not introduced. The offset region can be formed by introducing the impurity element after the formation of the insulating layer 575. In that case, the insulating layer 575 serves as a mask, like the insulating layer 571 or the like. Thus, the impurity element is not introduced into a region of the oxide 530b that overlaps with the insulating layer 575, and the electric resistivity of the region can be kept high.

In the transistor 510D, the insulating layer 575 is provided on the side surfaces of the insulating layer 570, the conductive layer 560, the metal oxide 552, the insulating layer 550, and the oxide 530c. The insulating layer 575 is preferably an insulator having a low dielectric constant. For example, the insulating layer 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. For the insulating layer 575, it is particularly preferable to use silicon oxide, silicon oxynitride, silicon nitride oxide, or porous silicon oxide because an excess-oxygen region can be easily formed in the insulating layer 575 in a later step. In addition, silicon oxide and silicon oxynitride are preferable because of their thermal stability. The insulating layer 575 preferably has a function of diffusing oxygen.

The transistor 510D also includes the insulating layer 574 over the insulating layer 575 and the oxide 530. The insulating layer 574 is preferably deposited by a sputtering method. When a sputtering method is used, an insulator containing few impurities such as water and hydrogen can be deposited. For example, for the insulating layer 574, aluminum oxide is preferably used.

Note that, in some cases, an oxide film formed by a sputtering method extracts hydrogen from the structure body over which the oxide film is deposited. Thus, the hydrogen concentrations in the oxide 530 and the insulating layer 575 can be reduced when the insulating layer 574 absorbs hydrogen and water from the oxide 530 and the insulating layer 575.

Note that this embodiment can be combined with other embodiments or an example in this specification as appropriate.

Embodiment 5

In this embodiment, examples of electronic components and electronic devices in which the semiconductor device or the like described in the above embodiment is incorporated will be described.

<Electronic Components>

First, examples of electronic components in which the semiconductor device 300 is incorporated will be described with reference to FIGS. 17(A) and 17(B).

Figure 17A:
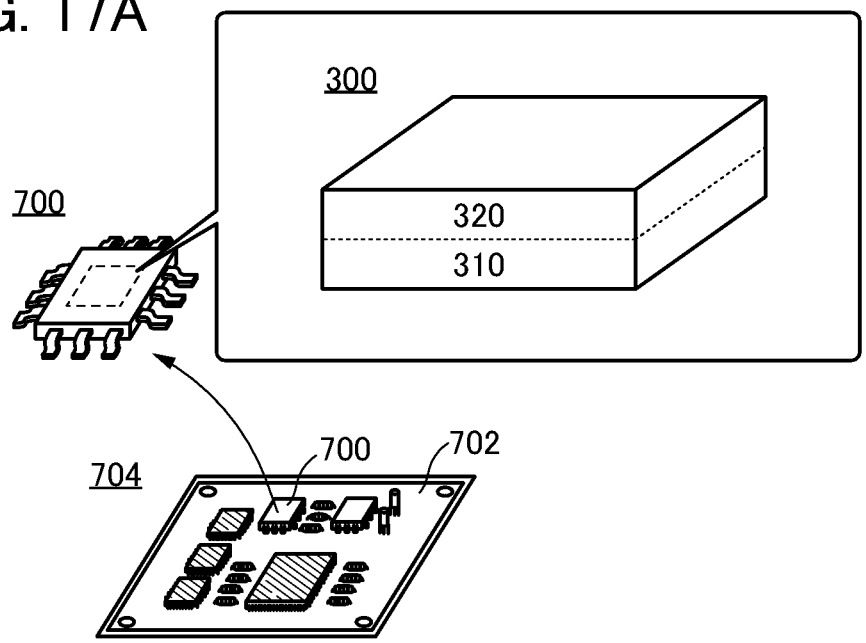
FIGS. 17A and 17B Perspective views illustrating examples of electronic components.

FIG. 17(A) is a perspective view of an electronic component 700 and a substrate on which the electronic component 700 is mounted (a mounting board 704). The electronic component 700 illustrated in FIG. 17(A) is an IC chip and includes a lead and a circuit portion. The electronic component 700 is mounted on a printed circuit board 702, for example. A plurality of such IC chips are combined and electrically connected to each other on the printed circuit board 702, whereby the mounting board 704 is completed.

The semiconductor device 300 described in the above embodiment is provided as the circuit portion of the electronic component 700. Although a QFP (Quad Flat Package) is used as a package of the electronic component 700 in FIG. 17(A), the embodiment of the package is not limited thereto.

Figure 17B:
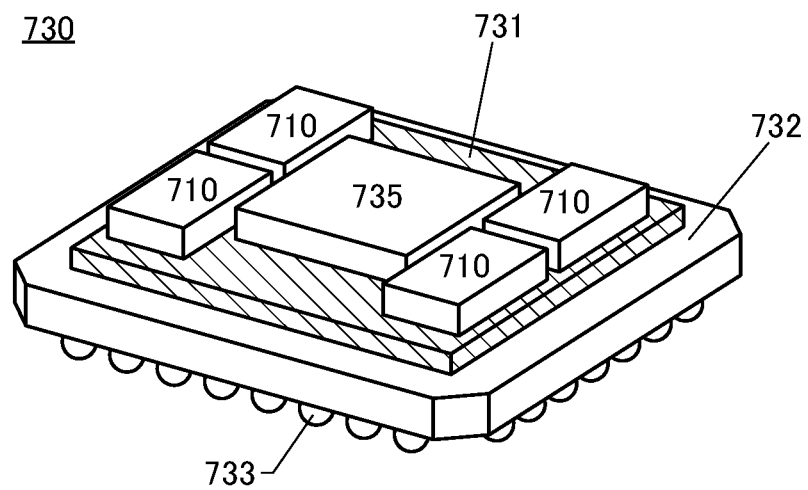

FIG. 17(B) is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of semiconductor devices 710 are provided on the interposer 731.

The electronic component 730 includes the semiconductor devices 710. Examples of the semiconductor devices 710 include the semiconductor device 300 and a high bandwidth memory (HBM). An integrated circuit (a semiconductor device) such as a CPU, a GPU, an FPGA, or a memory device can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to an HBM. Therefore, formation of minute and high-density wirings is required for an interposer on which an HBM is mounted. For this reason, a silicon interposer is preferably used as the interposer on which an HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5D mounting) in which a plurality of integrated circuits are arranged side by side on an interposer.

A heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the semiconductor devices 710 and the semiconductor device 735 are preferably equal to each other.

To mount the electronic component 730 on another substrate, an electrode 733 may be provided on the bottom portion of the package substrate 732. FIG. 17(B) illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP, QFJ (Quad Flat J-leaded package), or QFN (Quad Flat Non-leaded package) can be employed.

Note that this embodiment can be combined with other embodiments or an example in this specification as appropriate.

Embodiment 6

In this embodiment, examples of a product in which the semiconductor device or the electronic component described in the above embodiments is used for an electronic device will be described.

<Laptop Personal Computer>

Figure 18A:
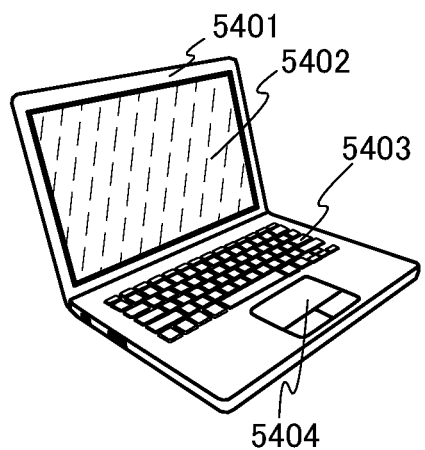
FIGS. 18A to 18H Perspective views illustrating examples of electronic devices.

The semiconductor device or the electronic component of one embodiment of the present invention can be used for a display provided in an information terminal device. FIG. 18(A) is a laptop personal computer, which is an information terminal device, and includes a housing 5401, a display portion 5402, a keyboard 5403, a pointing device 5404, and the like.

<Smartwatch>

Figure 18B:
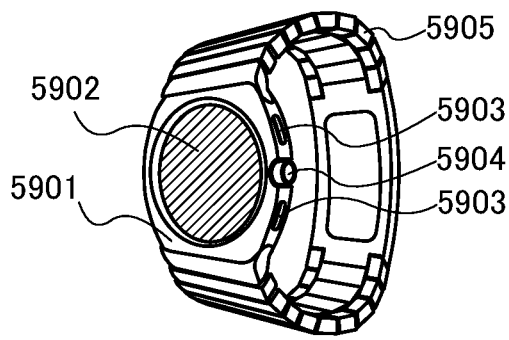

The semiconductor device or the electronic component of one embodiment of the present invention can be used for a wearable terminal. FIG. 18(B) is a smartwatch, which is a wearable terminal, and includes a housing 5901, a display portion 5902, operation buttons 5903, an operator 5904, a band 5905, and the like. In addition, a display device with a function of a position input device may be used for the display portion 5902. In addition, the function of the position input device can be added by provision of a touch panel in a display device. Alternatively, the function of the position input device can be added by provision of a photoelectric conversion element called a photosensor in a pixel portion of a display device. In addition, as the operation buttons 5903, any of a power switch for activating the smartwatch, a button for operating an application of the smartwatch, a volume control button, a switch for turning on or off the display portion 5902, and the like can be provided. In addition, although the number of the operation buttons 5903 is two in the smartwatch illustrated in FIG. 18(B), the number of the operation buttons of the smartwatch is not limited thereto. In addition, the operator 5904 functions as a crown used for setting the time on the smartwatch. In addition, the operator 5904 may be used as an input interface for operating an application of the smartwatch as well as the crown for time adjustment. Note that although the smartwatch illustrated in FIG. 18(B) has a structure with the operator 5904, without being limited thereto, a structure without the operator 5904 may be used.

<Video Camera>

Figure 18C:
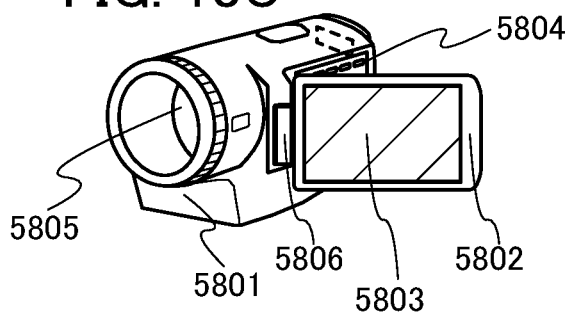

The semiconductor device or the electronic component of one embodiment of the present invention can be used for a video camera. The video camera illustrated in FIG. 18(C) includes a first housing 5801, a second housing 5802, a display portion 5803, operation keys 5804, a lens 5805, a joint portion 5806, and the like. The operation keys 5804 and the lens 5805 are provided in the first housing 5801, and the display portion 5803 is provided in the second housing 5802. Furthermore, the first housing 5801 and the second housing 5802 are connected to each other with the joint portion 5806, and the angle between the first housing 5801 and the second housing 5802 can be changed with the joint portion 5806. A structure in which images on the display portion 5803 are changed in accordance with the angle at the joint portion 5806 between the first housing 5801 and the second housing 5802 may be employed.

<Mobile Phone>

Figure 18D:
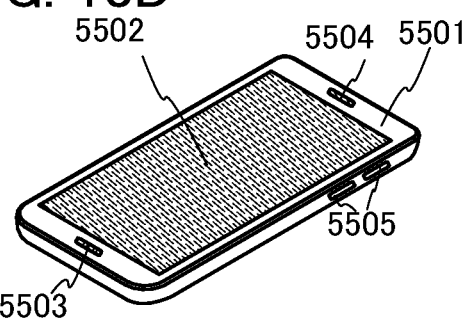

The semiconductor device or the electronic component of one embodiment of the present invention can be used for a mobile phone. FIG. 18(D) is a mobile phone having a function of an information terminal, which includes a housing 5501, a display portion 5502, a microphone 5503, a speaker 5504, and operation buttons 5505. A display device with a function of a position input device may be used for the display portion 5502. The function of the position input device can be added by provision of a touch panel in a display device. Alternatively, the function of the position input device can be added by provision of a photoelectric conversion element called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided.

Although the mobile phone in FIG. 18(D) includes two operation buttons 5505, the number of the operation buttons included in the mobile phone is not limited thereto. Although not illustrated, the mobile phone illustrated in FIG. 18(D) may include a light-emitting device for use as a flash light or a lighting device.

<Television Device>

Figure 18E:
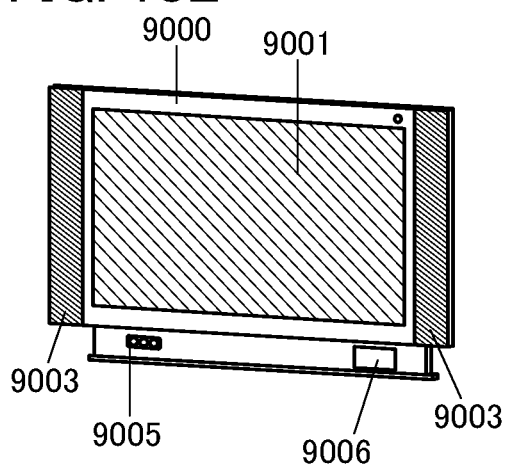

The semiconductor device or the electronic component of one embodiment of the present invention can be provided in a television device. A television device illustrated in FIG. 18(E) includes a housing 9000, a display portion 9001, a speaker 9003, an operation key 9005 (including a power switch or an operation switch), a connection terminal 9006, and the like. The television device can include the display portion 9001 having a large screen size of, for example, 50 inches or more, or 100 inches or more.

<Vehicle>

The semiconductor device or the electronic component of one embodiment of the present invention can be used around a driver's seat in a car, which is a vehicle.

Figure 18F:
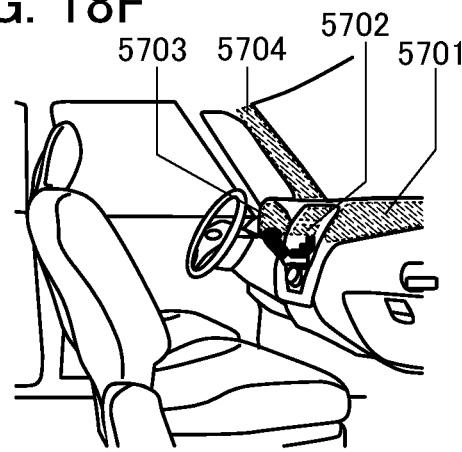

FIG. 18(F) is a figure that illustrates a windshield and its vicinity inside a car, for example. In FIG. 18(F), a display panel 5701, a display panel 5702, and a display panel 5703 attached to a dashboard, and a display panel 5704 attached to a pillar are illustrated.

The display panel 5701 to the display panel 5703 can display a variety of information such as navigation information, a speedometer, a tachometer, a mileage, a fuel meter, a gearshift state, and air-conditioner settings. In addition, the display content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car body leads to elimination of blind areas and enhancement of safety. In addition, showing an image that compensates for the areas which cannot be seen makes it possible to confirm safety more easily and comfortably. The display panel 5704 can also be used as a lighting device.

<Game Machine>

Figure 18G:
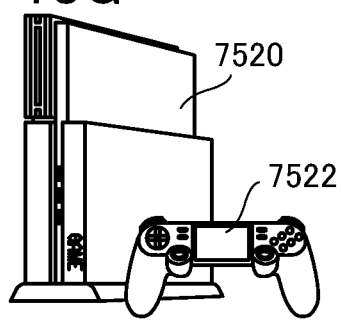
Figure 18H:
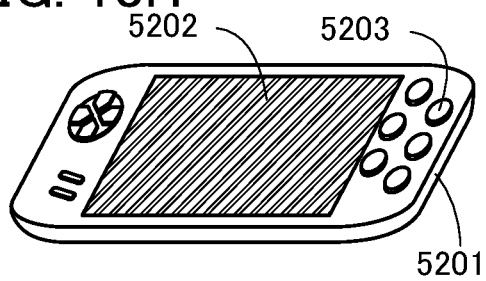

The semiconductor device or the electronic component of one embodiment of the present invention can be used for a stationary game machine or a portable game machine. FIG. 18(G) illustrates a stationary game machine, which includes a game machine 7520 and a controller 7522 that can be connected without a wire or with a wire. FIG. 18(H) illustrates a portable game machine, and the portable game machine includes a housing 5201, a display portion 5202, and a button 5203.

Note that this embodiment can be combined with other embodiments or an example in this specification as appropriate.

Example

In the semiconductor device of one embodiment of the present invention described in Embodiment 1, the amount of the bias current generated in the circuit 103 was calculated using a circuit simulator. This example describes the calculation and its results.

The software used in the calculation is the circuit simulator SmartSpice (version 4.26.7.R) produced by Silvaco, Inc. The amount of the bias current was calculated using the circuit simulator.

Figure 19:
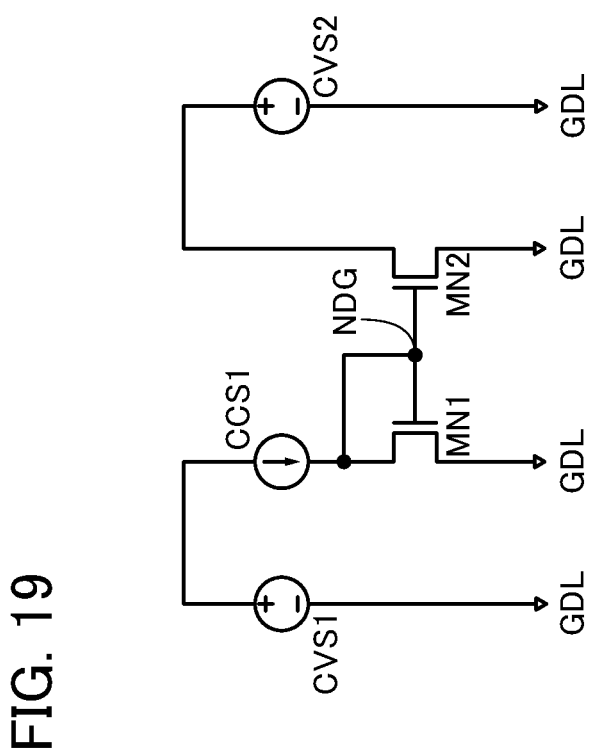
FIG. 19 A circuit diagram illustrating a structure example of a semiconductor device.

FIG. 19 illustrates a circuit structure used for this calculation. The circuit structure illustrated in FIG. 19 includes a transistor MN1, a transistor MN2, a constant voltage source CVS1, a constant voltage source CVS2, and a constant current source CCS1.

A first terminal of the transistor MN1 is electrically connected to an output terminal of the constant current source CCS1, a gate of the transistor MN1, and a gate of the transistor MN2, and a second terminal of the transistor MN1 is electrically connected to a wiring GDL. A first terminal of the transistor MN2 is electrically connected to a positive electrode terminal of the constant voltage source CVS2, and a second terminal of the transistor MN2 is electrically connected to the wiring GDL. Note that an electrical connection point between the gate of the transistor MN1 and the gate of the transistor MN2 is denoted by a node NDG.

A positive electrode terminal of the constant voltage source CVS1 is electrically connected to an input terminal of the constant current source CCS1, and a negative electrode terminal of the constant voltage source CVS1 is electrically connected to the wiring GDL. A negative electrode terminal of the constant voltage source CVS2 is electrically connected to the wiring GDL.

The wiring GDL is a wiring for supplying a ground potential.

In the circuit structure illustrated in FIG. 19, the transistor MN1 and the constant current source CCS1 correspond to the circuit 104 described in Embodiment 1. The transistor MN2 corresponds to the circuit 103 described in Embodiment 1. In this example, with a current value $I_{in}$ flowing thought the constant current source CCS1 and a voltage value $V_{in}$ supplied between the positive electrode terminal and the negative electrode terminal by the constant voltage source CVS2 as parameters, a source-drain current $I_{DS}$ of the transistor MN2 and a potential $V_{NDG}$ of the node NDG were calculated.

Specifically, $I_{DS}$ and $V_{GS}$ were calculated with the voltage value $V_{in}$ supplied between the positive electrode terminal and the negative electrode terminal by the constant voltage source CVS2 ranging from 0 V to 3.6 V inclusive under five conditions of the current value flowing through the constant current source CCS1, 0.1 μA, 0.2 μA, 0.5 μA, 1.0 μA, and 2.0 μA.

Note that the voltage value applied between the positive electrode terminal and the negative electrode terminal of the constant voltage source CVS1 was 10 V. As for the size of each of the transistor MN1 and the transistor MN2, the channel length was 1.0 μm and the channel width was 1.0 μm.

Figure 20A:
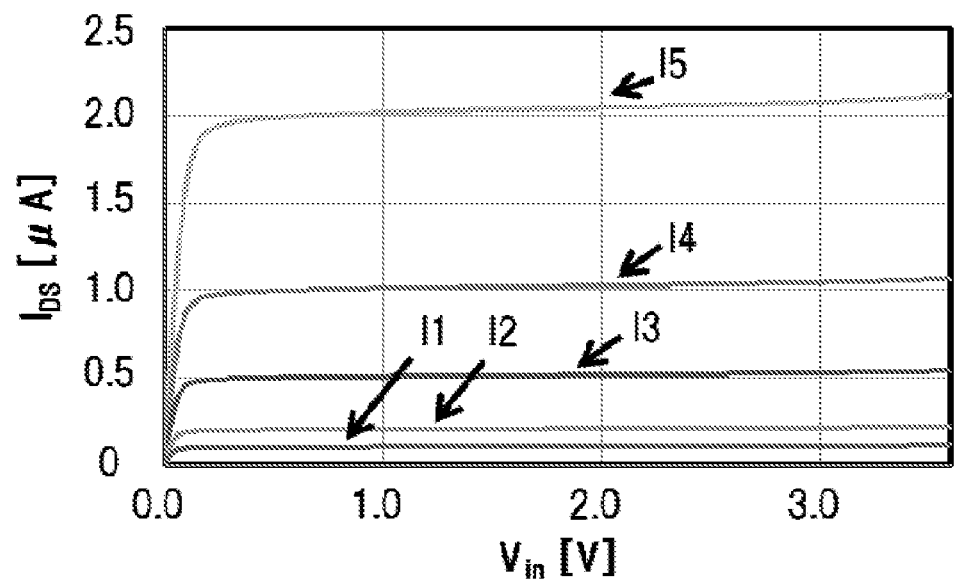
FIG. 20 (A) A graph showing a current output from a semiconductor device in accordance with an input current and an applied potential. (B) A graph showing a potential of a specific node of a semiconductor device in accordance with an input current and an applied potential.
Figure 20B:
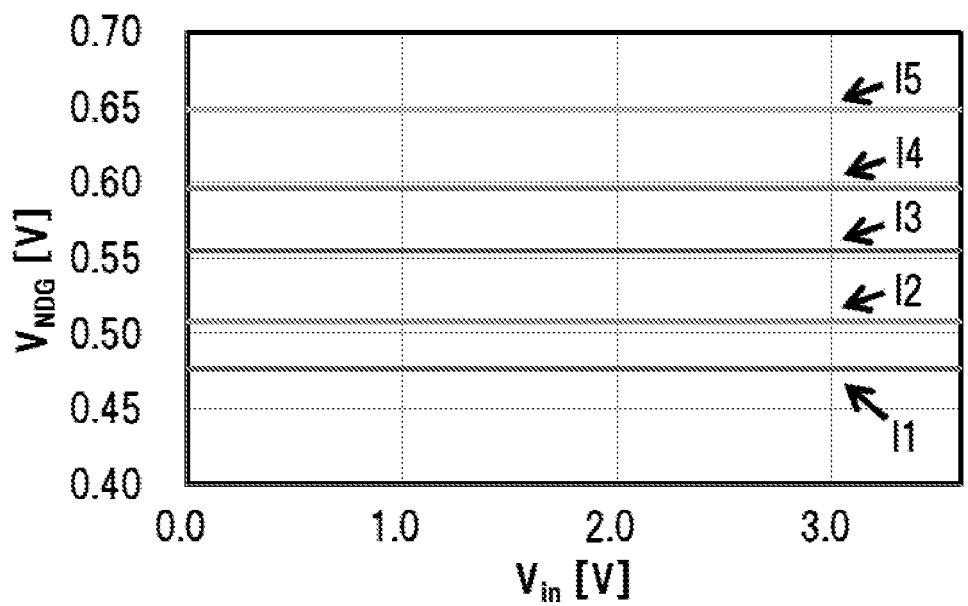

FIGS. 20(A) and 20(B) show the calculation results.

FIG. 20(A) is a graph in which the horizontal axis represents the voltage value $V_{in}$ and the vertical axis represents the current value $I_{DS}$. Note that a condition I1 to a condition I5 shown in FIG. 20(A) represent the current values flowing through the constant current source CCS1, 0.1 μA, 0.2 μA, 0.5 μA, 1.0 μA, and 2.0 μA.

From FIG. 20(A), it is found that the current flowing through the constant current source CCS1 and the source-drain current $I_{DS}$ flowing through the transistor MN2 are substantially equal to each other in the range of the voltage value $V_{in}$ supplied between the positive electrode terminal and the negative electrode terminal by the constant voltage source CVS2 of 0 V to 3.6 V inclusive under the condition I1 to the condition I3. It is found that the current flowing through the constant current source CCS1 and the source-drain current $I_{DS}$ flowing through the transistor MN2 are substantially equal to each other at a voltage value $V_{in}$ of approximately 1 V under the condition I4 and the condition I5, $I_{DS}$ is larger than the current flowing through the constant current source CCS1 under the condition I4 at a voltage value $V_{in}$ of approximately 3 V or more or under the condition I5 at a voltage value $V_{in}$ of approximately 2 V or more, and the difference becomes larger as the voltage value $V_{in}$ becomes higher.

FIG. 20(B) is a graph in which the horizontal axis represents the voltage value $V_{in}$ and the vertical axis represents the potential $V_{NDG}$. From FIG. 20(B), it is found that the potential $V_{NDG}$ is approximately 0.476 V under the condition I1, approximately 0.508 V under the condition I2, approximately 0.555 V under the condition I3, approximately 0.597 V under the condition I4, and approximately 0.648 V under the condition I5.

The amount of the bias current can be increased or decreased with the use of the regulator circuit 102 included in the semiconductor device 100 described in Embodiment 1. In the case of this example, the potential of the node NDG can be increased or decreased by providing the regulator circuit 102 between the gate of the transistor MN1 and the gate of the transistor MN2, whereby the source-drain current $I_{DS}$ (the bias current) flowing through the transistor MN2 can be increased or decreased.

Note that in the case where the bias current is increased or decreased by a given amount, the degree of change in the potential of the node NDG can be estimated from the results shown in FIGS. 20(A) and 20(B). For example, in the case where the bias current is to be increased from 0.5 µA to 1.0 µA, the potential of the node NDG should be increased from 0.555 V to 0.597 V. For example, in the case where the bias current is to be decreased from 1.0 µA to 0.2 µA, the potential of the node NDG should be decreased from 0.597 V to 0.508 V.

Note that this example can be combined with other embodiments in this specification as appropriate.

(Notes on the Description in this Specification and the Like)

The following are notes on the description of structures in the embodiments and example in this specification.

<Notes on One Embodiment of the Present Invention Described in Embodiments and Example>

One embodiment of the present invention can be constituted by appropriately combining the structure described in each embodiment and example with any of the structures described in the other embodiments. In addition, in the case where a plurality of structure examples are described in one embodiment, the structure examples can be combined as appropriate Note that what is described (or part thereof) in one embodiment or example can be applied to, combined with, or replaced with at least one of another content (or part thereof) in the embodiment or example and what is described (or part thereof) in another embodiment or other embodiments.

Note that in each embodiment or example, a content described in the embodiment or example is a content described with reference to a variety of diagrams or a content described with text in the specification.

Note that by combining a diagram (or part thereof) described in one embodiment or one example with at least one of another part of the diagram, a different diagram (or part thereof) described in the embodiment or example, and a diagram (or part thereof) described in another embodiment, other embodiments, or an example, much more diagrams can be formed.

<Notes on Ordinal Numbers>

Ordinal numbers such as "first," "second," and "third" in this specification and the like are used in order to avoid confusion among components. Thus, the terms do not limit the number of components. In addition, the terms do not limit the order of components. In this specification and the like, for example, a "first" component in one embodiment (or example) can be referred to as a "second" component in other embodiments (or example) or claims. Furthermore, in this specification and the like, for example, a "first" component in one embodiment (or example) can be omitted in other embodiments or claims.

<Notes on Description for Drawings>

Embodiments (or example) are described with reference to drawings. However, the embodiments (or example) can be implemented with various different modes. It is readily understood by those skilled in the art that modes and details can be changed in various ways without departing from the spirit and scope of the present invention. Thus, the present invention should not be interpreted as being limited to the description of the embodiments (or example). Note that in the structures of the invention in the embodiments (or the structure in the example), the same portions or portions having similar functions are denoted by the same reference numerals in different drawings, and a repetitive description of such portions is omitted.

In this specification and the like, the terms for explaining arrangement, such as "over" and "under", are used for convenience to describe the positional relation between components with reference to drawings. The positional relation between components is changed as appropriate in accordance with a direction in which the components are described. Thus, terms for describing arrangement are not limited to those described in this specification and the like and can be rephrased as appropriate according to circumstances. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly above or directly below and in direct contact with another component. For example, the expression "an electrode B over an insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

<Notes on Expressions that can be Rephrased>

In this specification and the like, expressions "one of a source and a drain" (or a first electrode or a first terminal) and "the other of the source and the drain" (or a second electrode or a second terminal) are used in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate may be referred to as a first terminal and a second terminal or as a third terminal and a fourth terminal. Note that in this specification and the like, a channel formation region refers to a region where a channel is formed; this region is formed by application of a potential to the gate, so that current can flow between the source and the drain.

Furthermore, functions of a source and a drain might be switched when a transistor of opposite polarity is employed or a direction of current flow is changed in circuit operation, for example. Thus, the terms of source and drain are interchangeably used in this specification and the like.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, voltage and potential can be replaced with each other as appropriate. The voltage refers to a potential difference from a reference potential. When the reference potential is a ground potential, for example, the voltage can be expressed as the potential. The ground potential does not necessarily mean 0 V. Potentials are relative values, and the potential applied to a wiring or the like is changed depending on the reference potential, in some cases.

Note that in this specification and the like, the terms "film," "layer," and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film," "layer," or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring", "signal line", "power source line", and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line", "power source line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

<Notes on Definitions of Terms>

Definitions of the terms that are mentioned in the above embodiments and example are described below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies might be formed by entry of impurities such as hydrogen. Furthermore, when the semiconductor is a silicon layer, examples of an impurity that changes characteristics of the semiconductor include oxygen, Group 1 elements except hydrogen, Group 2 elements, Group 13 elements, and Group 15 elements.

<<Switch>>

In this specification and the like, a switch is in a conduction state (on state) or in a non-conduction state (off state) to determine whether current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

In an example of the case where X and Y are electrically connected, at least one element that allows electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off That is, the switch has a function of being in a conduction state (on state) or a non-conduction state (off state) to determine whether current flows or not.

For example, in the case where X and Y are functionally connected, at least one circuit that enables functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are regarded as being functionally connected when a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

REFERENCE NUMERALS

SH1: holding circuit, SH2: holding circuit, TLa1: terminal, TLa2: terminal, TLa3: terminal, TLa4: terminal, TLa5: terminal, TLb1: terminal, TLb2: terminal, TLb3: terminal, TLb4: terminal, TLc1: terminal, TLc2: terminal, TLc3: terminal, TLd1: terminal, TLd2: terminal, TLd3: terminal, SW1: switch, SW2: switch, SWa[1]: switch, SWa[n]: switch, SWb[1]: switch, SWb[n]: switch, C1: capacitor, C2: capacitor, C3: capacitor, C3[1]: capacitor, C3[$n$]: capacitor, C4: capacitor, SWL: wiring, SW1L: wiring, SW2L: wiring, SWBL[1]: wiring, SWBL[n]: wiring, REFL: wiring, OUTL: wiring, ADJL: wiring, ADJL[1]: wiring, ADJL[n]: wiring, CTL: wiring, REGL: wiring, CRFL: wiring, CLKL: wiring, VDDL: wiring, VDD2L: wiring, GNDL: wiring, OP1: operational amplifier, Tr1: transistor, Tr2: transistor, Tr3: transistor, Tr4: transistor, Try: transistor, Tr6: transistor, Tr7: transistor, OTr1: transistor, OTr2: transistor, R1: resistor, R2: resistor, ND1: node, ND2: node, CI: constant current source, BUF: buffer circuit, BUF[1]: buffer circuit, BUF[n]: buffer circuit, ABUF: analog buffer circuit, MUX: multiplexer, CMP1: comparator, CMP2: clocked comparator, TLA1: terminal, TLA2: terminal, TLA3: terminal, TLA4: terminal, TLA5: terminal, TLB1: terminal, TLB2: terminal, TLB3: terminal, TLB4: terminal, TLC1: terminal, TLC2: terminal, TLC3: terminal, TLD1: terminal, TLD2: terminal, TLD3: terminal, OP2: operational amplifier, Tr11: transistor, Tr12: transistor, Tr13: transistor, Tr14: transistor, Tr15: transistor, Tr16: transistor, Tr17: transistor, R11: resistor, R12: resistor, GND2L: wiring, MN1: transistor, MN2: transistor, GDL: wiring, CCS1: constant current source, CVS1: constant voltage source, CVS2: constant voltage source, NDG: node, 100: semiconductor device, 100A: semiconductor device, 101: circuit, 102: regulator circuit, 102a: circuit, 102a[1]: circuit, 102a[n]: circuit, 103: circuit, 104: circuit, 200: semiconductor device, 200A: semiconductor device, 201: circuit, 202: regulator circuit, 203: circuit, 204: circuit, 231: substrate, 232: element isolation layer, 233a: transistor, 233b: transistor, 233c: transistor, 234: insulating layer, 235: insulating layer, 236: contact plug, 237: insulating layer, 238: electrode, 239: insulating layer, 240: insulating layer, 241: insulating layer, 242: electrode, 243: insulating layer, 244: insulating layer, 245: electrode, 246: insulating layer, 247: insulating layer, 248: insulating layer, 249: electrode, 250: insulating layer, 251: electrode, 300: semiconductor device, 310: layer, 320: layer, 361: insulating layer, 362: insulating layer, 363: insulating layer, 364: insulating layer, 365: insulating layer, 366: insulating layer, 367: electrode, 368a: transistor, 368b: transistor, 369a: capacitor, 369b: capacitor, 371: insulating layer, 372: insulating layer, 373: insulating layer, 374: contact plug, 375: electrode, 376: insulating layer, 377: insulating layer, 378: insulating layer, 379: insulating layer, 380: electrode, 381:

insulating layer, 382: insulating layer, 503: conductive layer, 505: conductive layer, 505*a*: conductive layer, 505*b*: conductive layer, 510A: transistor, 510B: transistor, 510C: transistor, 510D: transistor, 511: insulating layer, 512: insulating layer, 514: insulating layer, 516: insulating layer, 521: insulating layer, 522: insulating layer, 524: insulating layer, 530: oxide, 530*a*: oxide, 530*b*: oxide, 530*c*: oxide, 531*a*: region, 531*b*: region, 542: conductive layer, 542*a*: conductive layer, 542*b*: conductive layer, 544: insulating layer, 545: insulating layer, 546: conductive layer, 546*a*: conductive layer, 546*b*: conductive layer, 547*a*: conductive layer, 547*b*: conductive layer, 550: insulating layer, 552: metal oxide, 560: conductive layer, 560*a*: conductive layer, 560*b*: conductive layer, 570: insulating layer, 571: insulating layer, 574: insulating layer, 575: insulating layer, 576: insulating layer, 576*a*: insulating layer, 576*b*: insulating layer, 580: insulating layer, 582: insulating layer, 584: insulating layer, 700: electronic component, 702: printed circuit board, 704: mounting board, 710: semiconductor device, 730: electronic component, 731: interposer, 732: package substrate, 733: electrode, 735: semiconductor device, 5201: housing, 5202: display portion, 5203: button, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: connection portion, 5901: housing, 5902: display portion, 5903: operation button, 5904: operator, 5905: band, 7520: game machine, 7522: controller, 9000: housing, 9001: display portion, 9003: speaker, 9005: operation key, 9006: connection terminal.

The invention claimed is:

1. A semiconductor device comprising a first circuit comprising a first capacitor and a second capacitor, a second circuit comprising a first transistor, a third circuit, and a first holding circuit,
   wherein the first holding circuit comprises a first holding portion,
   wherein the first holding circuit has a function of bringing the first holding portion into an electrically floating state to hold a first potential of the first holding portion,
   wherein the first circuit has a function of changing the first potential of the first holding portion to a second potential,
   wherein the first circuit further comprises a buffer circuit,
   wherein the second circuit has a function of generating a bias current based on the first potential or the second potential of the first holding portion,
   wherein the third circuit comprises a first terminal, a second terminal, and a third terminal,
   wherein the third circuit has a function of generating a third potential in accordance with an input potential to the second terminal of the third circuit by supply of the bias current to the first terminal of the third circuit and outputting the third potential from the third terminal of the third circuit,
   wherein a first terminal of the first capacitor is directly connected to the first holding portion,
   wherein a first terminal of the second capacitor is directly connected to a gate of the first transistor, and
   wherein an output terminal of the buffer circuit is electrically connected to a second terminal of the first capacitor.

2. The semiconductor device according to claim 1,
   wherein the first circuit has a function of changing the first potential held in the first holding portion to the second potential by capacitive coupling of the first capacitor when a fourth potential is input to the second terminal of the first capacitor after the first holding circuit brings the first holding portion into the electrically floating state.

3. The semiconductor device according to claim 1,
   wherein the first holding circuit comprises a second transistor and a third capacitor,
   wherein the first holding portion is electrically connected to a first terminal of the second transistor and a first terminal of the third capacitor, and
   wherein the first transistor comprises a metal oxide in a channel formation region.

4. The semiconductor device according to claim 3, further comprising a fourth circuit,
   wherein the fourth circuit has a function of allowing a constant current to flow,
   wherein the fourth circuit is electrically connected to a second terminal of the first transistor, and
   wherein the first potential in accordance with the constant current is input to the first terminal of the second transistor when the first transistor is in a conduction state.

5. The semiconductor device according to claim 1, further comprising a second holding circuit,
   wherein the second holding circuit comprises a second holding portion,
   wherein the second holding portion is electrically connected to the second terminal of the third circuit, and
   wherein the second holding circuit has a function of bringing the second holding portion into an electrically floating state to hold the input potential to the second terminal of the third circuit.

6. The semiconductor device according to claim 5,
   wherein the second holding circuit comprises a third transistor and a fourth capacitor,
   wherein the second holding portion is electrically connected to a first terminal of the third transistor and a first terminal of the fourth capacitor,
   wherein the input potential is input to a second terminal of the second transistor, and
   wherein the second transistor comprises a metal oxide in a channel formation region.

7. An electronic component comprising the semiconductor device according to claim 1 and an integrated circuit over a printed circuit board.

8. An electronic device comprising the semiconductor device according to claim 1 and a housing.

9. The semiconductor device according to claim 1,
   wherein the first terminal of the first capacitor is electrically connected to the gate of the first transistor, and
   wherein the first terminal of the second capacitor is electrically connected to the first holding portion.

10. A semiconductor device comprising a first circuit comprising a first capacitor and a second capacitor, a second circuit comprising a first transistor, a third circuit, and a first holding circuit,
   wherein the first holding circuit comprises a first holding portion,
   wherein the first holding circuit has a function of bringing the first holding portion into an electrically floating state to hold a first potential of the first holding portion, wherein the first circuit has a function of changing the first potential of the first holding portion to a second potential, wherein the first circuit further comprises a multiplexer, wherein the second circuit has a function of generating a bias current based on the first potential or the second potential of the first holding portion, wherein the third circuit comprises a first terminal, a second terminal, and a third terminal, wherein the third circuit has a function of generating a third potential in accordance with an input potential to the second terminal of the third circuit by supply of the bias current to the first terminal of the third circuit and outputting the third potential from the third terminal of the third circuit, wherein a first terminal of the first capacitor is directly connected to the first holding portion, wherein a first terminal of the second capacitor is directly connected to a gate of the first transistor, and wherein an output terminal of the multiplexer is electrically connected to a second terminal of the first capacitor.

11. The semiconductor device according to claim 10, wherein the first circuit has a function of changing the first potential held in the first holding portion to the second potential by capacitive coupling of the first capacitor when a fourth potential is input to the second terminal of the first capacitor after the first holding circuit brings the first holding portion into the electrically floating state.

12. The semiconductor device according to claim 10, wherein the first holding circuit comprises a second transistor and a third capacitor, wherein the first holding portion is electrically connected to a first terminal of the second transistor and a first terminal of the third capacitor, and wherein the first transistor comprises a metal oxide in a channel formation region.

13. The semiconductor device according to claim 12, further comprising a fourth circuit, wherein the fourth circuit has a function of allowing a constant current to flow, wherein the fourth circuit is electrically connected to a second terminal of the first transistor, and wherein the first potential in accordance with the constant current is input to the first terminal of the second transistor when the first transistor is in a conduction state.

14. The semiconductor device according to claim 10, further comprising a second holding circuit, wherein the second holding circuit comprises a second holding portion, wherein the second holding portion is electrically connected to the second terminal of the third circuit, and wherein the second holding circuit has a function of bringing the second holding portion into an electrically floating state to hold the input potential to the second terminal of the third circuit.

15. The semiconductor device according to claim 14, wherein the second holding circuit comprises a third transistor and a fourth capacitor, wherein the second holding portion is electrically connected to a first terminal of the third transistor and a first terminal of the fourth capacitor, wherein the input potential is input to a second terminal of the second transistor, and wherein the second transistor comprises a metal oxide in a channel formation region.

16. An electronic component comprising the semiconductor device according to claim 10 and an integrated circuit over a printed circuit board.

17. An electronic device comprising the semiconductor device according to claim 10 and a housing.

18. The semiconductor device according to claim 10, wherein the first terminal of the first capacitor is electrically connected to the gate of the first transistor, and wherein the first terminal of the second capacitor is electrically connected to the first holding portion.

* * * * *